(12) United States Patent
Mizuno et al.

(10) Patent No.: US 8,473,108 B2
(45) Date of Patent: Jun. 25, 2013

(54) INFORMATION APPARATUS AND METHOD OF OPTIMIZING COOLING EFFICIENCY OF AIR CONDITIONER

(75) Inventors: Jun Mizuno, Yokohama (JP); Kiyokazu Saigo, Sagamihara (JP); Tadakatsu Nakajima, Kasumigaura (JP); Jun Okitsu, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 317 days.

(21) Appl. No.: 12/993,148

(22) PCT Filed: Nov. 9, 2010

(86) PCT No.: PCT/JP2010/006558
§ 371 (c)(1),
(2), (4) Date: Nov. 17, 2010

(87) PCT Pub. No.: WO2012/063278
PCT Pub. Date: May 18, 2012

(65) Prior Publication Data
US 2012/0116595 A1   May 10, 2012

(51) Int. Cl.
*G05B 13/00* (2006.01)
(52) U.S. Cl.
USPC .................. 700/277; 713/324; 705/319
(58) Field of Classification Search
USPC .................. 700/277; 713/324; 705/319
See application file for complete search history.

(56) References Cited

U.S. PATENT DOCUMENTS

| | | | | |
|---|---|---|---|---|
| 2004/0107125 A1* | 6/2004 | Guheen et al. | | 705/7 |
| 2007/0271475 A1* | 11/2007 | Hatasaki et al. | | 713/324 |
| 2008/0065919 A1* | 3/2008 | Hatasaki et al. | | 713/324 |
| 2009/0276095 A1* | 11/2009 | Pienta et al. | | 700/277 |
| 2009/0327778 A1 | 12/2009 | Shiga et al. | | |
| 2010/0083015 A1* | 4/2010 | Yokota et al. | | 713/310 |
| 2010/0106988 A1 | 4/2010 | Hayashi et al. | | |

FOREIGN PATENT DOCUMENTS

| | | |
|---|---|---|
| JP | 2010108115 A | 5/2010 |
| WO | 2009126154 A1 | 10/2009 |
| WO | 2010032501 A1 | 3/2010 |

\* cited by examiner

*Primary Examiner* — Mohammad Ali
*Assistant Examiner* — Anthony Whittington
(74) *Attorney, Agent, or Firm* — Volpe and Koenig, P.C.

(57) ABSTRACT

An air conditioner that cools inside a room wherein a plurality of server apparatuses is arranged, is driven with high efficiency. An information apparatus is communicatively coupled to a plurality of server apparatuses each capable of implementing a virtual server, stores a relation between a cooling performance and a cooling efficiency of an air conditioner that cools a room wherein the server apparatuses are arranged stores a history of load on each of the server apparatuses, the load being generated by a virtual server implemented in the server apparatus, creates a plurality of virtual server allocation patterns having varying allocations of virtual servers to be implemented by the server apparatuses, simulates, for each of the created allocation patterns, an amount of heat generation of each of the server apparatuses on the basis of the history of load on the server apparatus, seeks a cooling performance required to be offered by the air conditioner on a basis of the simulated amount of heat generation, and identifies the allocation pattern with which the cooling efficiency corresponding to the sought cooling performance is not less than a threshold set in advance.

9 Claims, 22 Drawing Sheets

AIR CONDITIONER PHYSICAL POSITION MANAGEMENT TABLE

| AIR CONDITIONER NAME | X COORDINATE | Y COORDINATE | Z COORDINATE |
|---|---|---|---|
| AIR CONDITIONER A | 1.0 | 5.0 | 3.0 |
| AIR CONDITIONER B | 1.0 | 15.0 | 3.0 |
| AIR CONDITIONER C | 1.0 | 25.0 | 3.0 |

RACK PHYSICAL POSITION MANAGEMENT TABLE

| RACK NAME | X COORDINATE | Y COORDINATE | Z COORDINATE |
|---|---|---|---|
| RACK A | 5.0 | 3.0 | — |
| RACK B | 6.0 | 3.0 | — |
| ⋮ | ⋮ | ⋮ | — |
| RACK N | 9.0 | 7.0 | — |

Fig. 13

INFORMATION DEVICE PHYSICAL POSITION MANAGEMENT TABLE 403

| DEVICE NAME | MOUNTING RACK NAME | X COORDINATE | Y COORDINATE | Z COORDINATE |
|---|---|---|---|---|
| SERVER A | RACK A | 5.0 | 3.0 | 2.0 |
| SERVER B | RACK A | 5.0 | 3.0 | 1.5 |
| ⋮ | ⋮ | ⋮ | ⋮ | ⋮ |
| SERVER N | RACK N | 9.0 | 7.0 | 1.5 |
| STORAGE A | RACK A | 5.0 | 3.0 | 0.8 |
| STORAGE N | RACK A | 5.0 | 3.0 | 0.4 |

Fig. 14

AIR CONDITIONER CHARACTERISTIC CURVE MANAGEMENT TABLE 430

| AIR CONDITIONER NAME | CHARACTERISTIC CURVE FUNCTION | COP THRESHOLD |
|---|---|---|
| AIR CONDITIONER A | AIR CONDITIONING EFFICIENCY $= a_0 x^n + a_1 x^{n-1} + \cdots + a_{n-1} x + a_n$ (x: COOLING PERFORMANCE) | Tha |
| AIR CONDITIONER B | AIR CONDITIONING EFFICIENCY $= b_0 x^n + b_1 x^{n-1} + \cdots + b_{n-1} x + b_n$ (x: COOLING PERFORMANCE) | Thb |
| AIR CONDITIONER C | AIR CONDITIONING EFFICIENCY $= c_0 x^n + c_1 x^{n-1} + \cdots + c_{n-1} x + c_n$ (x: COOLING PERFORMANCE) | Thc |

AIR CONDITIONING ZONE MANAGEMENT TABLE 440

| AIR CONDITIONING ZONE NAME | AIR CONDITIONER | RACK |
|---|---|---|
| ZONE A | AIR CONDITIONER A | RACK A,B,C,···,N |
| ZONE B | AIR CONDITIONER B | RACK O,P,Q,···,S |
| ZONE C | AIR CONDITIONER C | RACK T,U,···,Z |

Fig. 17

INFORMATION SERVER CONFIGURATION MANAGEMENT TABLE 411

| SERVER NAME | NUMBER OF CPU CORES | CPU TYPE | AMOUNT OF INSTALLED MEMORY | STORAGE CAPACITY | NETWORK BANDWIDTH |
|---|---|---|---|---|---|
| SERVER A | 16 | TYPE S | 2TByte | 4TByte | 10Gbps |
| SERVER B | 8 | TYPE S | 1TByte | 2TByte | 10Gbps |
| ... | ... | ... | ... | ... | ... |
| SERVER N | 16 | TYPE T | 4TByte | 16TByte | 10Gbps |

Fig. 18

VIRTUAL SERVER CONFIGURATION MANAGEMENT TABLE 412

| VIRTUAL SERVER NAME | SERVER NAME | CPU ALLOCATION AMOUNT | MEMORY ALLOCATION AMOUNT | STORAGE CAPACITY ALLOCATION AMOUNT | NETWORK BANDWIDTH ALLOCATION AMOUNT |
|---|---|---|---|---|---|
| VIRTUAL SERVER A | SERVER A | 20% | 100GByte | 1TByte | 1Gbps |
| VIRTUAL SERVER B | SERVER A | 30% | 300GByte | 1TByte | 1Gbps |
| ... | ... | ... | ... | ... | ... |
| VIRTUAL SERVER Z | SERVER N | 50% | 200GByte | 2TByte | 1Gbps |

Fig. 19

RAID GROUP CONFIGURATION MANAGEMENT TABLE 413

| RAID GROUP NAME | STORAGE NAME | HDD TYPE | RAID LEVEL | CAPACITY |
|---|---|---|---|---|
| RG01 | STORAGE A | FC | 5 | 1TByte |
| RG02 | STORAGE A | FC | 5 | 1TByte |
| ... | ... | ... | ... | ... |
| RGXX | STORAGE B | SAS | 6 | 2TByte |

Fig. 20

LOGICAL VOLUME CONFIGURATION MANAGEMENT TABLE 414

| LOGICAL VOLUME NAME | STORAGE NAME | RAID GROUP NAME | CAPACITY |
|---|---|---|---|
| LU01 | STORAGE A | RG01 | 200GByte |
| LU02 | STORAGE A | RG01 | 300GByte |
| ... | ... | ... | ... |
| LUYY | STORAGE B | RGXX | 1TByte |

Fig. 23

RAID GROUP PERFORMANCE MANAGEMENT TABLE 413

| TIME | STORAGE NAME | RAID GROUP NAME | I/O THROUGHPUT |
|---|---|---|---|
| AUGUST 16, 2010, 18:00:00 | STORAGE A | RG01 | 2Gbps |
| AUGUST 16, 2010, 18:00:00 | STORAGE A | RG02 | 1Gbps |
| ⋮ | ⋮ | ⋮ | ⋮ |
| AUGUST 16, 2010, 18:00:00 | STORAGE B | RGXX | 7Gbps |

Fig. 24

LOGICAL VOLUME PERFORMANCE MANAGEMENT TABLE 424

| TIME | STORAGE NAME | LOGICAL VOLUME NAME | I/O THROUGHPUT |
|---|---|---|---|
| AUGUST 16, 2010, 18:00:00 | STORAGE A | LU01 | 500Mbps |
| AUGUST 16, 2010, 18:00:00 | STORAGE A | LU02 | 320Mbps |
| ⋮ | ⋮ | ⋮ | ⋮ |
| AUGUST 16, 2010, 18:00:00 | STORAGE B | LUYY | 600Mbps |

Fig. 25

INFORMATION SERVER LOAD PREDICTION
MANAGEMENT TABLE
451

| TIME | SERVER NAME | CPU UTILIZATION RATE |
|---|---|---|
| AUGUST 16, 2010, 19:00:00 | SERVER A | 30% |
| AUGUST 16, 2010, 20:00:00 | SERVER A | 20% |
| AUGUST 16, 2010, 21:00:00 | SERVER A | 10% |
| ⋮ | ⋮ | ⋮ |

Fig. 26

VIRTUAL SERVER LOAD PREDICTION MANAGEMENT TABLE
452

| TIME | VIRTUAL SERVER NAME | CPU UTILIZATION RATE |
|---|---|---|
| AUGUST 16, 2010, 19:00:00 | VIRTUAL SERVER A | 60% |
| AUGUST 16, 2010, 20:00:00 | VIRTUAL SERVER A | 20% |
| AUGUST 16, 2010, 21:00:00 | VIRTUAL SERVER A | 5% |
| ⋮ | ⋮ | ⋮ |

RAID GROUP LOAD PREDICTION MANAGEMENT TABLE 453

| TIME | STORAGE NAME | RAID GROUP NAME | I/O THROUGHPUT |
|---|---|---|---|
| AUGUST 16, 2010, 19:00:00 | STORAGE A | RG01 | 100Mbps |
| AUGUST 16, 2010, 20:00:00 | STORAGE A | RG01 | 10Mbps |
| ⋮ | ⋮ | ⋮ | ⋮ |

LOGICAL VOLUME LOAD PREDICTION MANAGEMENT TABLE 454

| TIME | STORAGE NAME | LOGICAL VOLUME NAME | I/O THROUGHPUT |
|---|---|---|---|
| AUGUST 16, 2010, 19:00:00 | STORAGE A | LU01 | 10Mbps |
| AUGUST 16, 2010, 20:00:00 | STORAGE A | LU01 | 500kbps |
| ⋮ | ⋮ | ⋮ | ⋮ |

INFORMATION APPARATUS AND METHOD OF OPTIMIZING COOLING EFFICIENCY OF AIR CONDITIONER

TECHNICAL FIELD

The present invention relates to an information apparatus and a method of optimizing cooling efficiency of air conditioners.

BACKGROUND ART

In recent years, along with advancement of information technology, various techniques have been developed for allowing flexible control of load on an information system configured of information devices such as a server apparatus, a storage apparatus, a network apparatus and the like.

For example, there has been developed a technique to implement one or a plurality of virtual servers by a virtualization mechanism of a server apparatus and also to migrate a virtual server operating on a certain server apparatus to another server apparatus.

In addition, there has been developed a technique to configure a RAID (Redundant Arrays of Inexpensive Disks) group including a plurality of storage media in a storage apparatus, then to provide a server apparatus or a virtual server with a part of a storage area provided by the RAID group as a logical volume, and to migrate a logical volume on a certain RAID group to another RAID group.

Further, various techniques have been developed for saving power consumption of an information system by use of the techniques described above (refer to PTL 1 and 2, for example).

PTL 1 discloses a method of controlling a plurality of storage apparatuses and an air conditioner by use of a management server. The method includes: calculating a plurality of combinations of allocations of availability for the plurality of storage apparatuses; calculating the amount of heat generation of each storage apparatus of the plurality of storage apparatuses for each of the plurality of combinations; calculating an amount of heat to be transmitted to the air conditioner on the basis of the amount of heat generation, and position information on the plurality of storage apparatuses and the air conditioner; calculating power consumption for cooling the amount of heat transmitted to the air conditioner; selecting a combination from the plurality of combinations on the basis of the power consumption of the air conditioner; and issuing a migration instruction to the plurality of storage apparatuses to migrate data stored in a first storage apparatus to a second storage apparatus, on the basis of the selected combination.

In addition, PTL 2 discloses, the implementation of reduced power consumption in a computer room consisting of information processing equipment and an air conditioner, in a short time, by optimizing allocation of workload to the information processing equipment. For the air conditioner, an air conditioner operation coefficient (COP of each equipment) relating to the information processing equipment is calculated. For the information processing equipment, an equipment-related power consumption formula which is the sum of the power of the equipment and the power of the air conditioner is created. From the equipment-related power consumption formula for the information processing equipment, the power consumption of the entire computer room is calculated. Using an index for evaluating the power reduction property which is based on the equipment-related power consumption formula for the information processing equipment, allocation of workload is determined so that the power consumption of the entire computer room may be reduced. Based on the determined allocation of workload, the workload on the information processing equipment is controlled. Furthermore, the power of the air conditioner is calculated from the COP of each equipment and the calculated value for the power of the information processing equipment. Based on the calculation results for the power of the air conditioner, the output of the air conditioner is controlled.

CITATION LIST

Patent Literature

PTL 1: Japanese Patent Application Laid-open Publication No. 2010-108115
PTL 2: International Publication No. 2010/032501 pamphlet

SUMMARY OF INVENTION

Technical Problem

In addition, a technique to operate an air conditioner for cooling an information system with high efficiency has been in demand.

In general, the information system is cooled by an air conditioner, and the cooling efficiency of the air conditioner offering the cooling performance depends on the cooling performance offered by the air conditioner.

In the case of an air conditioner equipped with a single compressor, commonly, it has a characteristic that the cooling efficiency of the air conditioner increases when the cooling performance increases. This is because the higher the cooling performance is, the higher the power efficiency of the compressor becomes in general. On the other hand, the lower the cooling performance is, the lower the cooling efficiency becomes.

Meanwhile, in the case of an air conditioner including a plurality of compressors, the cooling efficiency does not necessarily increase even if the cooling performance of the air conditioner increases. For example, in the case where the air conditioner needs to offer cooling performance slightly higher than that can be offered with a single compressor, two compressors are operated reducing the power efficiency per compressor. And as a result, the cooling efficiency of the air conditioner is reduced as well. In this case, the cooling efficiency of the air conditioner including the plurality of compressors is reduced around the cooling performance achieved immediately after an additional compressor newly starts operating.

The present invention has been made in view of the aforementioned problems and it is an object thereof to enable operation of an air conditioner with high efficiency, the air conditioner cooling a room wherein a plurality of server apparatuses is arranged.

Solution to Problem

One aspect of the present invention to achieve the above object provides an information apparatus, including a network port that communicatively couples to a plurality of server apparatuses each capable of implementing a virtual server, an air conditioner characteristic curve management table that stores a relation between a cooling performance and a cooling efficiency of an air conditioner that cools a room wherein the server apparatuses are arranged, a performance management table that stores a history of load on each of the server apparatuses, the load being generated by a virtual server implemented in the server apparatus, and a migration plan derivation unit that creates a plurality of virtual server allocation patterns having varying allocations of virtual servers to be implemented by the server apparatuses, simulates, for each of the created allocation patterns, an amount of heat generation of each of the server apparatuses on a basis of the history of load on the server apparatus, seeks a cooling performance required to be offered by the air conditioner on a basis of the simulated amount of heat generation, and identifies the allocation pattern with which the cooling efficiency corresponding to the sought cooling performance is not less than a threshold set in advance.

Other problems disclosed in the present application and solutions thereof will be made apparent from the description in the description of embodiments as well as the drawings and the like.

Advantageous Effects of Invention

According to the present invention, an air conditioner for cooling a room wherein a plurality of server apparatuses is arranged is operable with high efficiency.

BRIEF DESCRIPTION OF DRAWINGS

FIG. 13 is a diagram showing an information device physical position management table of the present embodiment.

FIG. 14 is a diagram showing an air conditioner characteristic curve management table of the present embodiment.

FIG. 17 is a diagram showing an information server configuration management table of the present embodiment.

FIG. 18 is a diagram showing a virtual server configuration management table of the present embodiment.

FIG. 19 is a diagram showing a RAID group configuration management table of the present embodiment.

FIG. 20 is a diagram showing a logical volume configuration management table of the present embodiment.

FIG. 23 is a diagram showing a RAID group performance management table of the present embodiment.

FIG. 24 is a diagram showing a logical volume performance management table of the present embodiment.

FIG. 25 is a diagram showing an information server load prediction management table of the present embodiment.

FIG. 26 is a diagram showing a virtual server load prediction management table of the present embodiment.

DESCRIPTION OF EMBODIMENTS

Hereinafter, an embodiment will be described with reference to the accompanying drawings.

==Overall Configuration==

Figure 1:
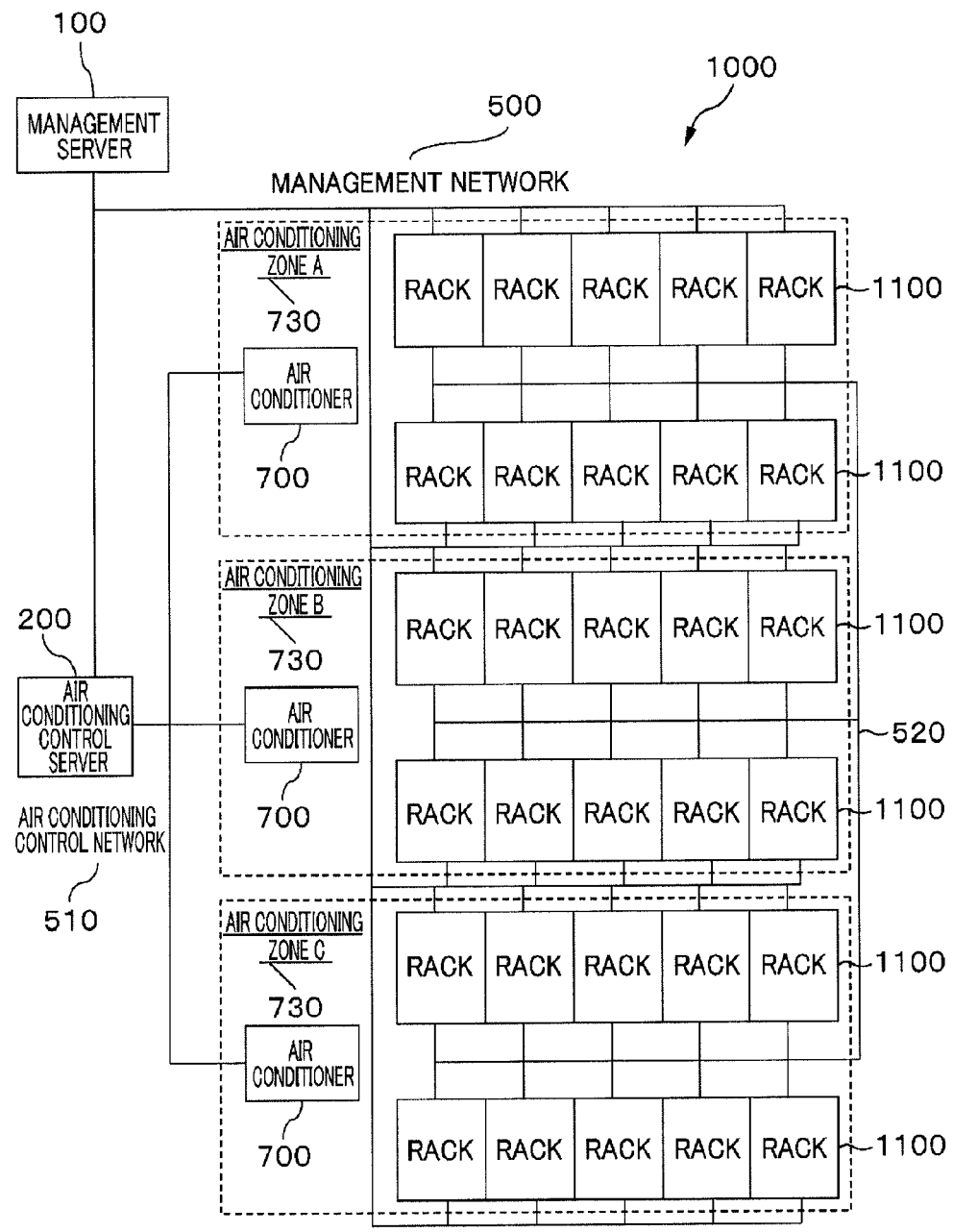
FIG. 1 is a diagram showing an overall configuration of an information system of the present embodiment.
Figure 2:
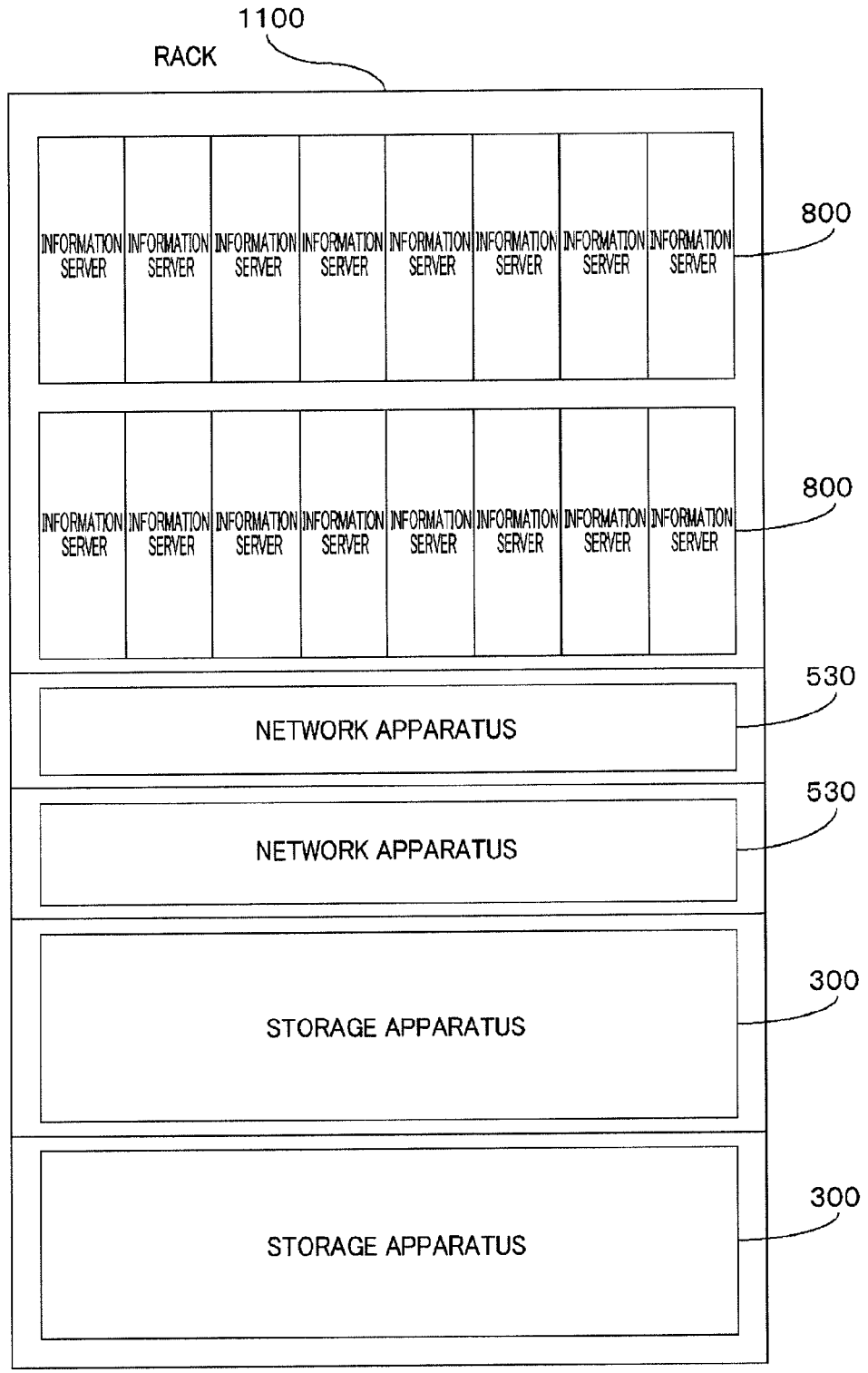
FIG. 2 is a diagram showing how information servers, network systems and storage apparatuses are mounted on a rack of the present embodiment.

An overall configuration of an information system 1000 to which the embodiment of the present invention is applied will be described with reference to FIGS. 1 and 2.

The information system 1000 according to the present embodiment is configured of a management server (information apparatus) 100, an air conditioning control server 200, a plurality of information servers (server apparatuses) 800, a plurality of network apparatuses 530 and a plurality of storage apparatuses 300. As shown in FIG. 2, the information servers 800, the network apparatuses 530 and the storage apparatuses 300 are mounted on a rack (chassis) 1100.

Further, a plurality of racks 1100 are arranged in each air conditioning zone 730 in a room. Each of the racks 1100 is configured to circulate air by taking in air from the front side thereof and discharging air from the rear side thereof, thereby cooling the information servers 800, the network apparatuses 530 and the storage apparatuses 300 mounted thereon.

In each of the air conditioning zones 730, the plurality of racks 1100 are arranged in a plurality of rows. The racks 1100 in the same row are arranged in such a way that the side surfaces of adjacent racks 1100 face each other so that the front or rear surface sides of the racks are arranged in the same direction. In addition, racks 1100 in adjacent rows are arranged in such a way that the front or rear surface sides of the racks 1100 face each other.

When the racks 1100 are arranged in the manner described above, a hot aisle where air containing heat drawn from the information servers 800, the network apparatuses 530 and the storage apparatuses 300 is collected is formed at an area between two rows of the racks 1100, where the discharge sides of the racks 1100 face each other. In addition, a cold aisle where air not yet containing heat drawn from the information servers 800, the network apparatuses 530 and the storage apparatuses 300 is collected is formed at an area between two rows of the racks 1100, where the intake sides of the racks 1100 face each other. When the racks 1100 are arranged in such a way that the cold aisles and the hot aisles are formed in the manner described above, the interior of the air conditioning zone 730 can be cooled more efficiently.

An air conditioner 700 is installed in each of the air conditioning zones 730. The air conditioners 700 respectively cool the air conditioning zones 730 where the air conditioners 700 are installed.

Note that, the air conditioning zones 730 may be in any form as long as the air conditioning zones 730 are spaces to be cooled by the air conditioners 700, respectively. For example, the air conditioning zones 730 may be rooms formed by partitioning a single server room by walls or the like, or may be areas where cooling effects are brought about by the respective air conditioners 700 in the server room although the areas are not partitioned by walls or the like.

The management server 100 is communicatively coupled to the information servers 800, the storage apparatuses 300 and the air conditioning control server 200 via a management network 500. The management server 100 is a computer that controls load on the information servers 800 and load on the storage apparatuses 300 to operate the air conditioner 700 in each of the air conditioning zones 730 with a high cooling efficiency.

As will be described later in detail, load on an information server 800 is controlled by migration of a virtual server 802 implemented by each information server 800. In addition, load on storage apparatuses 300 is controlled by migration (also referred to as moving) of a logical volume 390 implemented by each storage apparatus 300.

The information servers 800 and the storage apparatuses 300 are communicatively coupled to each other via an information network 520. Data communication among the information servers 800, data communication between the information servers 800 and the storage apparatuses 300 and data communication among the storage apparatuses 300 are performed via the information network 520.

Each of the network apparatuses 530 is an apparatus that communicatively couples the information servers 800 and the storage apparatuses 300 and also controls data communication performed via the information network 520.

The air conditioners 700 are communicatively coupled to the air conditioning control server 200 via an air conditioning control network 510.

The air conditioning control server 200 controls a setting temperature and an air volume of each of the air conditioners 700. The air conditioning control server 200 acquires information relating to the current operation conditions of the air conditioner 700, such as supply air temperature, exhaust temperature and the like from the air conditioner 700.

Note that, the number of air conditioners 700 to be installed may be one. In addition, the management network 500 and the air conditioning control network 510 may be integrated into the same network. Further, each of the air conditioners 700 may be configured to include the functions of the air conditioning control server 200 and to be communicatively coupled to the management server 100 directly.

Moreover, it is not necessary for all of the racks 1100 to include at least one of the information servers 800, the storage apparatuses 300 and the network apparatuses 530 mounted thereon. When the plurality of racks 1100 are arranged in an air conditioning zone 730, the plurality of racks 1100 may be a mixture of a rack 1100 including only at least one of the information servers 800, the network apparatuses 530 and the storage apparatus 300 mounted thereon, and a rack 1100 including none of these systems mounted.

<Information Server>

The information server 800 is a computer providing services such as an automated teller service of a bank, an Internet Web page browsing service and the like. For providing the aforementioned services, the information server 800 uses, as a data storage location, a storage area provided by the storage apparatus 300.

The information server 800 is, for example, a personal computer, a mainframe, an office computer or the like. The information server 800 transmits a data input/output request (hereinafter, referred to as a "data I/O request") to the storage apparatus 300 when accessing the aforementioned storage area.

Figure 3:
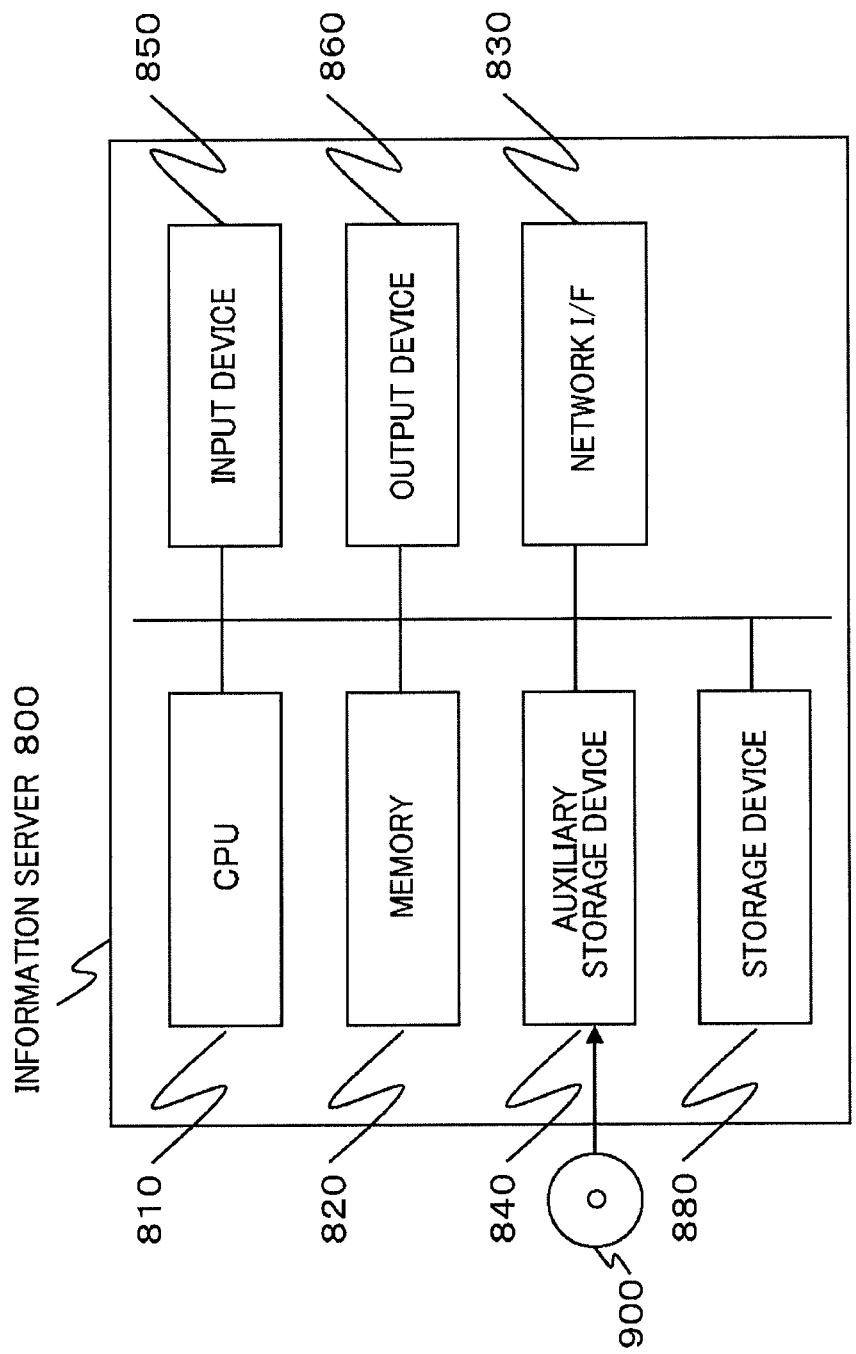
FIG. 3 is a diagram showing a configuration of an information server of the present embodiment.

As shown in FIG. 3, the information server 800 includes: a CPU 810; a volatile or nonvolatile memory 820 (RAM or ROM); an auxiliary storage device 840 for reading and writing data from and to a recording medium 900 such as a flexible disk or a CD, DVD and an optical disc; a storage device 880 (such as an HDD or a semiconductor storage device (SSD)); an input device 850 such as a keyboard or a mouse; an output device 860 such as a liquid crystal monitor or a printer; and a network interface (network I/F) 830 such as a NIC (Network Interface Card) or an HBA (Host Bus Adapter).

Figure 4:
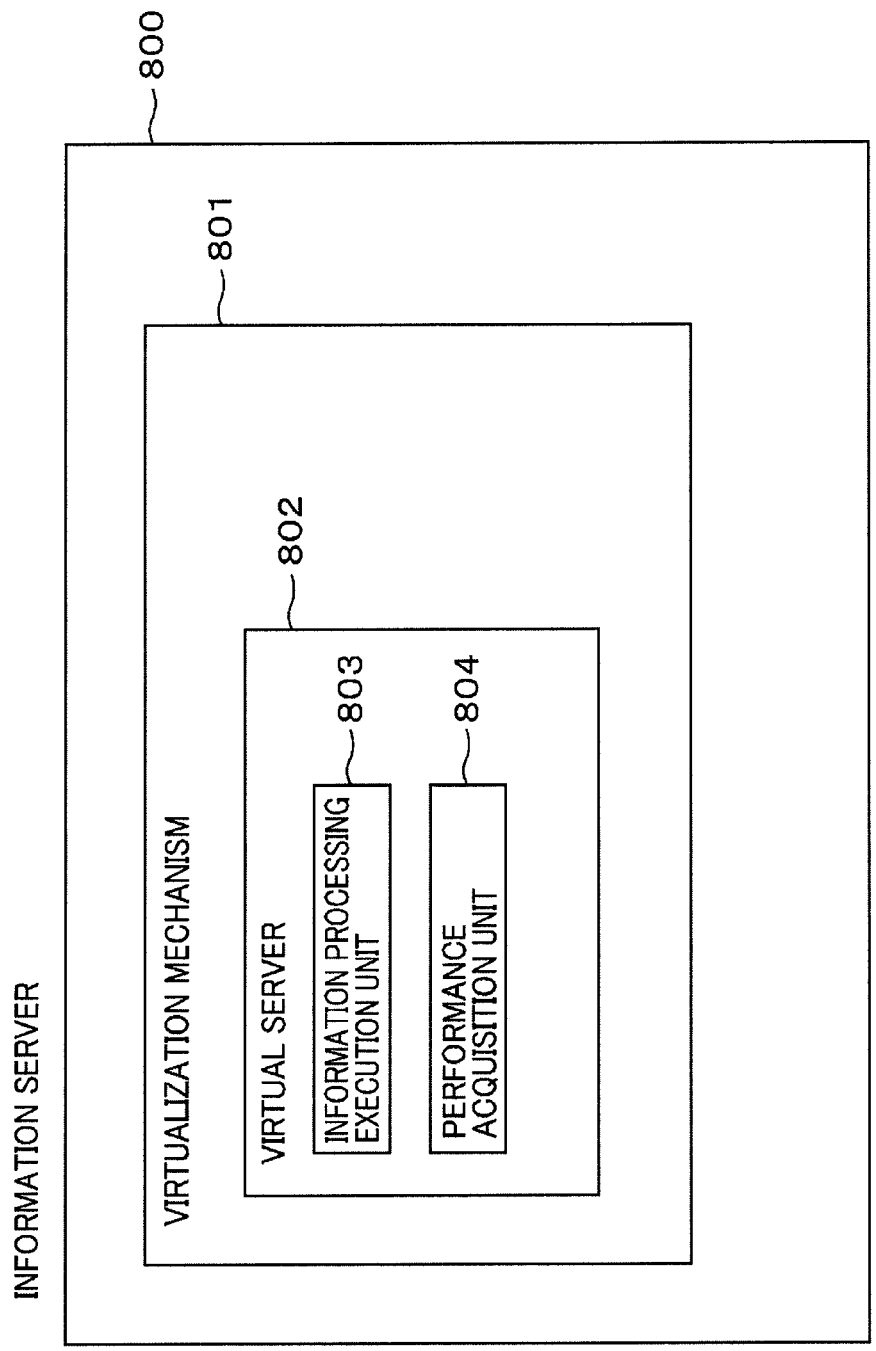
FIG. 4 is a diagram showing a configuration of an information server of the present embodiment.

Further, as shown in FIG. 4, the information server 800 includes a virtualization mechanism 801 and implements a virtual server 802.

The virtualization mechanism 801 is software for the information server 800 to implement the virtual server 802. The virtualization mechanism 801 may be so-called "host OS" virtualization software, or so-called "hypervisor" virtualization software.

When the virtualization mechanism 801 is the "host OS" virtualization software, the virtualization mechanism 801 implements the virtual server 802 while using an OS (operating system) function under the control of the OS executed by the information server 800. Meanwhile, when the virtualization mechanism 801 is the "hypervisor" virtualization software, the virtualization mechanism 801 implements the virtual server 802 without using the function of the OS executed by the information server 800.

Figure 5:
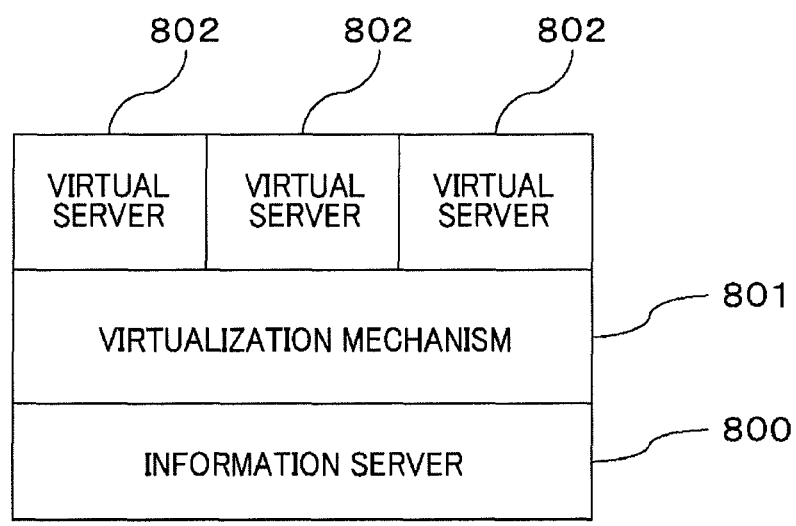
FIG. 5 is a diagram showing a configuration of an information server of the present embodiment.

FIG. 5 shows how the virtual servers 802 are implemented on the information server 800. As shown in FIG. 5, a plurality of virtual servers 802 can be implemented on a single information server 800 through execution of the virtualization mechanism 801 by the information server 800. In addition, the information server 800 is capable of migrating a virtual server 802 into another information server 800 under the control of the virtualization mechanism 801.

Each of the virtual servers 802 provides functions as an individual and independent computer while using, under the control of the virtualization mechanism 801, the functions and resources of the CPU 810, the memory 820, the auxiliary storage device 840, the storage device 880, the input device 850, the output device 860, the network I/F 830 and the like, which are included in the information server 800.

The virtualization mechanism 801 allocates the resources included in the information server 800, such as the CPU 810, the memory 820 and the like, to the virtual servers 802. Then, the virtualization mechanism 801 performs exclusive control in accordance with the allocation ratio of these resources to the virtual servers 802 when the virtual servers 802 use these resources.

For example, when the virtualization mechanism 801 allocates 20% of the entire processing capacity of the CPU 810 to a certain virtual server 802, the virtual server 802 is allowed to exclusively use the CPU 810 within the range of the processing capacity of 20%. Likewise, when the virtualization mechanism 801 allocates 50% of the entire capacity of the memory 820 to a certain virtual server 802, the virtual server 802 is allowed to exclusively use the CPU 810 within the range of the capacity of 50%.

Referring back to FIG. 4, the virtual server 802 includes an information processing execution unit 803 and a performance acquisition unit 804.

As described above, the virtual server 802 provides functions as an independent computer. For this reason, the virtual server 802 is capable of serving as a computer providing an automated teller service of a bank, an Internet Web browsing service or the like, for example.

The information processing execution unit 803 executes an OS or an application program by using the resources or functions of the CPU 810, the memory 820 and the like, which are allocated to the virtual server 802. Accordingly, the virtual server 802 functions as a computer providing the aforementioned services. At this time, the virtual server 802 provides the aforementioned various services while using a data storage area provided by a storage apparatus 300.

The performance acquisition unit 804 acquires information relating to performance of the virtual server 802. The information relating to the performance of the virtual server 802 includes the utilization of the CPU 810 and the amount of usage of the memory 820, which are allocated to the virtual server 802, the number of data I/O requests issued to the storage apparatus 300 per unit time, the number of transmissions or receptions performed via the information network 520 per unit time and the like.

Note that, the virtualization mechanism 801 may be configured to acquire the information relating to the performance of the virtual server 802.

<Storage Apparatus>

Figure 6:
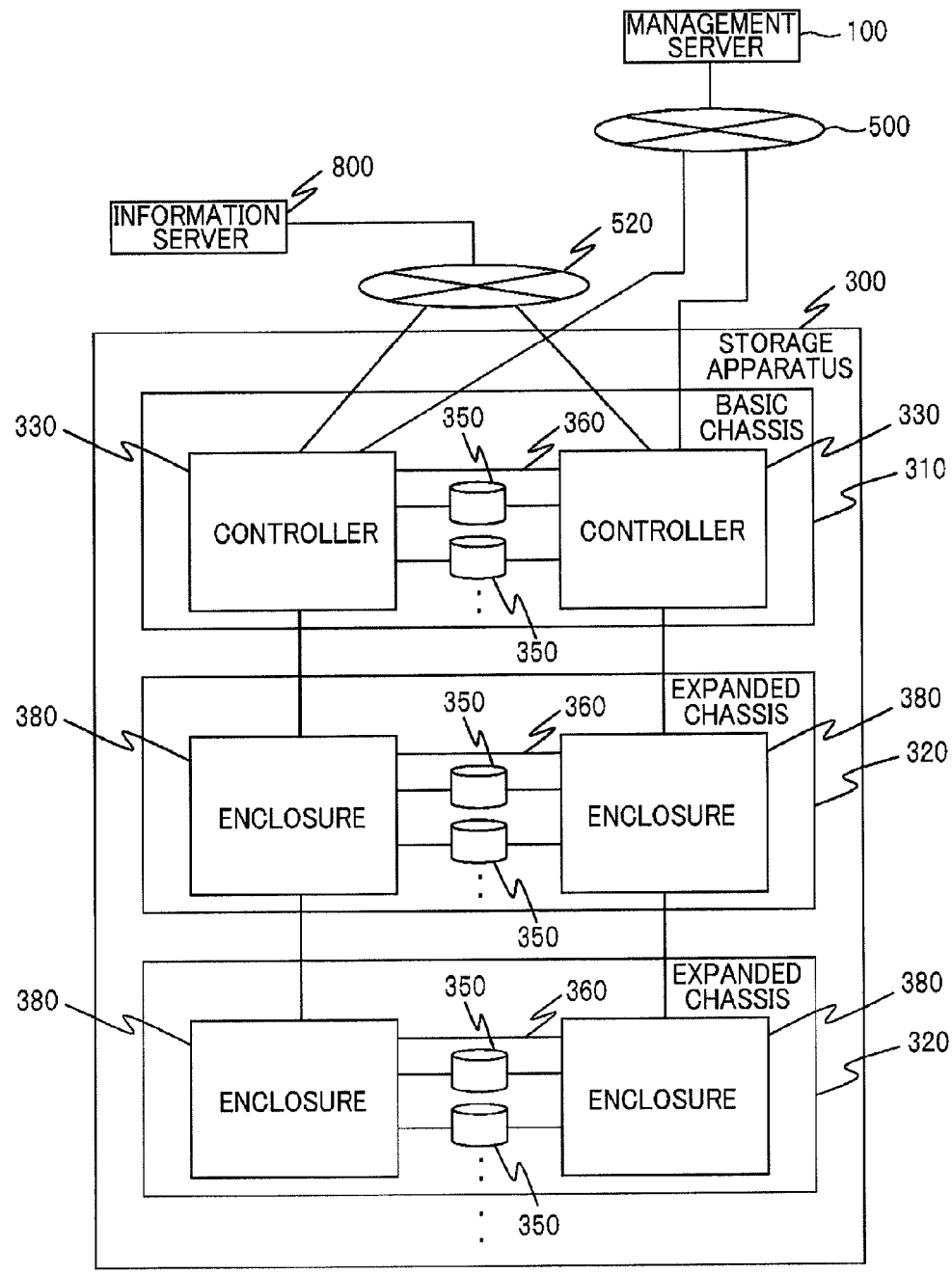
FIG. 6 is a diagram showing a configuration of a storage apparatus of the present embodiment.

FIG. 6 illustrates an example of a schematic configuration of the storage apparatus 300 according to the present embodiment. As shown in FIG. 6, the storage apparatus 300 is communicatively coupled to the information server 800 via the information network 520 and is also communicatively coupled to the management server 100 via the management network 500.

The information network 520 is a LAN (Local Area Network), a SAN (Storage Area Network), the Internet, a public communication network or the like, for example. Communications between the information server 800 and the storage apparatus 300 are performed with the use of protocols such as TCP/IP, iSCSI (internet Small Computer System Interface), Fibre Channel Protocol, FICON (Fibre Connection) (registered trademark), ESCON (Enterprise System Connection) (registered trademark), ACONARC (Advanced Connection Architecture) (registered trademark), FIBARC (Fibre Connection Architecture) (registered trademark) or the like.

The management network 500 is a LAN, the Internet, a public communication network or the like, for example.

The storage apparatus 300 according to the present embodiment includes a basic chassis 310 and one or more expanded chassis 320 coupled to the basic chassis 310 by cascade connection. In this configuration, the basic chassis 310 according to the present embodiment includes two controllers 330 and one or more storage drives 350 communicatively coupled to the controllers 330. The controllers 330 are communicatively coupled to each other via a communication line 360 such as a bus.

Each of the controllers 330 and the storage drives 350 is formed in an individual device unit and is thus attached to and detached from the basic chassis 310 when the controller 330 or the storage device 350 is inserted into or removed from an attachment slot provided to the basic chassis 310. Although not illustrated, various devices such as a cooling device (cooling fan or the like) for cooling heating elements such as the storage drives 350, and a power supply device for driving the controllers 330, the storage drives 350, the cooling device and the like are also provided to the basic chassis 310.

Each of the expanded chassis 320 includes two enclosures 380 and one or more storages drives 350 communicatively coupled to the enclosures 380. The enclosures 380 are communicatively coupled to each other via a communication line 360 such as a bus. Each of the enclosures 380 and the storage drives 350 is formed in an individual device unit and is thus attached to and detached from the expanded chassis 320 when the enclosure 380 or the storage device 350 is inserted into or removed from an attachment slot provided to the expanded chassis 320. Although not illustrated, various devices such as a cooling device (cooling fan or the like) for cooling heating elements such as the storage drives 350, and a power supply device for driving the storage drives 350, the cooling device and the like are also provided to the expanded chassis 320.

The storage drive 350 is a device including a nonvolatile recording medium for recording data. The storage device 350 is available in various forms, e.g., a SAS (Serial Attached SCSI), SATA (Serial ATA), FC (Fibre Channel), PATA (Parallel ATA) or SCSI (Small Computer Interface) hard disk drive, and a semiconductor storage device (SSD) including a semiconductor memory such as a flash memory embedded therein.

Figure 7:
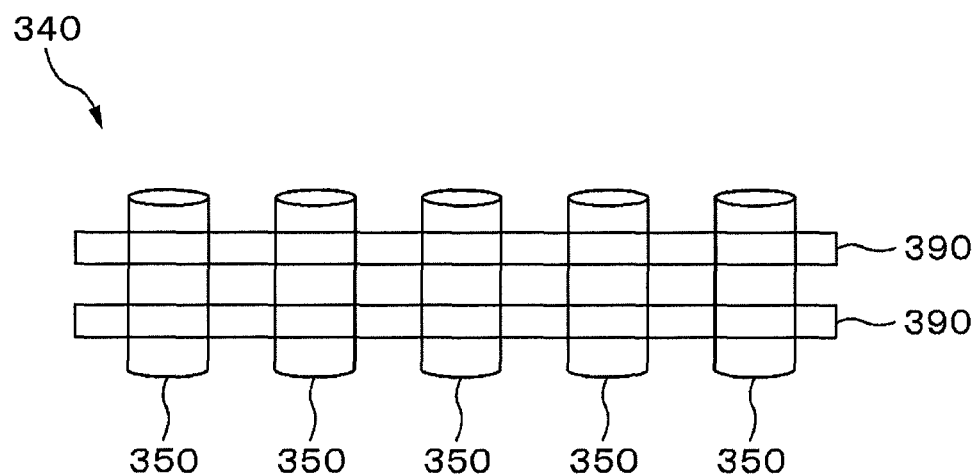
FIG. 7 is a diagram showing a configuration of a RAID group of the present embodiment.

Moreover, as shown in FIG. 7, a RAID (Redundant Arrays of Inexpensive Disks) group 340 is configured by use of a plurality of storage devices 350.

Logical volumes 390 are formed in the RAID group 340. The storage apparatus 300 provides the logical volumes 390 to an information server 800 and a virtual server 802. The information server 800 and the virtual server 802 use the logical volumes 390 as storage areas to provide various services. An identifier identifying an individual logical volume 390 is referred to as an LUN (Logical Unit Number). The LUN may be set in a data input/output request transmitted to a storage apparatus 300 from an information server 800 or virtual server 802, for example.

Upon receipt of the data input/output request from the information server 800 or virtual server 802, the controller 330 performs writing of data or reading of data to or from the storage drive 350. In addition, the controller 330 changes the setting or configuration of the RAID group 340, increases or decreases the number of storage drives 350, changes the setting or configuration of the logical volume 390, migrates the logical volume 390 and the like in accordance with a setting command transmitted from the management server 100.

The logical volume 390 can be migrated between the RAID groups 340 in the same storage apparatus 300, and can be also migrated between RAID groups 340 in different storage apparatuses 300.

<Air Conditioner>

Each of the air conditioners 700 receives an instruction indicating a setting temperature from the air conditioning control server 200 and performs air conditioning control so that the temperature in a corresponding one of the air conditioning zones 730 reaches the preset temperature. In addition, upon receipt of a request for information relating to the operation conditions such as a supply air temperature, an exhaust temperature and the like from the air conditioning control server 200, the air conditioner 700 transmits the information to the air conditioning control server 200.

Figure 8:
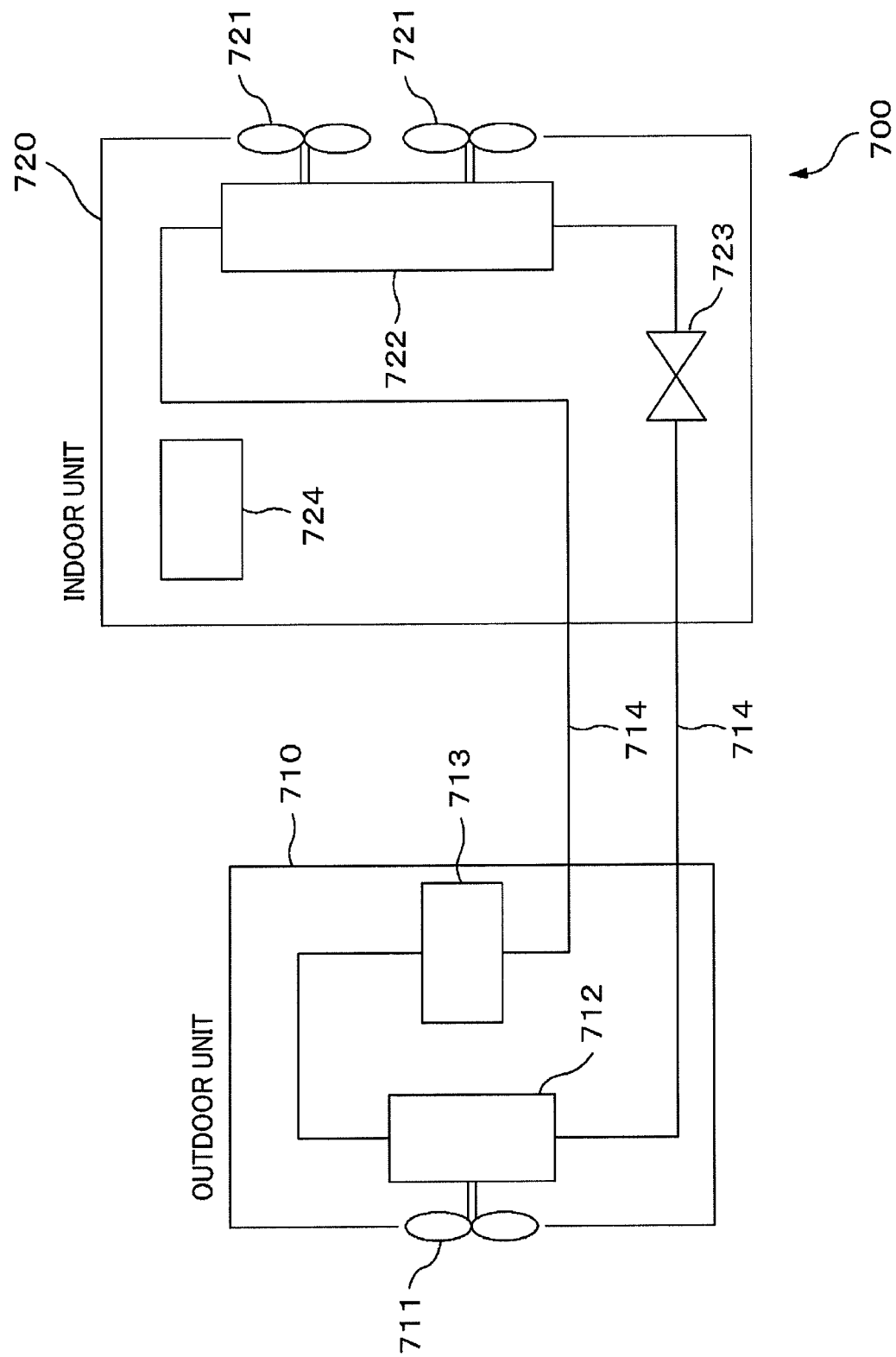
FIG. 8 is a diagram showing a configuration of an air conditioner of the present embodiment.

As shown in FIG. 8, the air conditioner 700 is configured to include an outdoor unit 710 and an indoor unit 720. In addition, the outdoor unit 710 and the indoor unit 720 are coupled to each other via refrigerant piping 714.

The indoor unit 720 includes an evaporator 722, fans 721, a controller 724 and an electronic expansion valve 723. The outdoor unit 710 includes a condenser 712, a fan 711 and a compressor 713.

The controller 724 included in the air conditioner 700 offers a required cooling performance by controlling the aforementioned components included in the outdoor unit 710 and the indoor unit 720 and thus performs air conditioning control of the air conditioning zone 730.

To be specific, refrigerant condensed by the condenser 712 is lead to the indoor unit 720 via a refrigerant piping 714 and the pressure of the refrigerant is reduced at the electronic expansion valve 723. Then, the refrigerant under reduced pressure is lead to the evaporator 722 and vaporized in the evaporator 722 by absorption of heat from the air in the air conditioning zone 730. Then the vaporized refrigerant is lead to the outdoor unit 710 via the refrigerant piping 714. And thereafter, the refrigerant pressurized in the compressor 713 is cooled and condensed again in the condenser 712.

The compressor 713 according to the present embodiment is a constant speed compressor and switches between an operating state and a non-operating state under the control of the controller 724.

The controller 724 controls the compressor 713 to be in the operating state or the non-operating state on the basis of the set temperature of the air conditioning zone 730, which is transmitted from the air conditioning control server 200, and the current temperature in the air conditioning zone 730, and thereby offers the cooling performance required for the air conditioner 700. The compressor 713 operates at a constant speed regardless of the cooling performance required for the air conditioner 700, during the period the compressor 713 is controlled to be in the operating state. Thus, the cooling efficiency of the air conditioner 700 improves as the cooling performance of the air conditioner 700 is increased.

Note that, the cooling performance of the air conditioner 700 is the ability to cool the air conditioning zone 730 and can be expressed by the amount of heat taken from the air conditioning zone 730 per unit hour, for example. In addition, the cooling efficiency of the air conditioner 700 can be expressed by a ratio of the cooling performance required for the air conditioner 700 to the electric power that the air conditioner 700 consumes to offer the cooling performance, for example.

Figure 9:
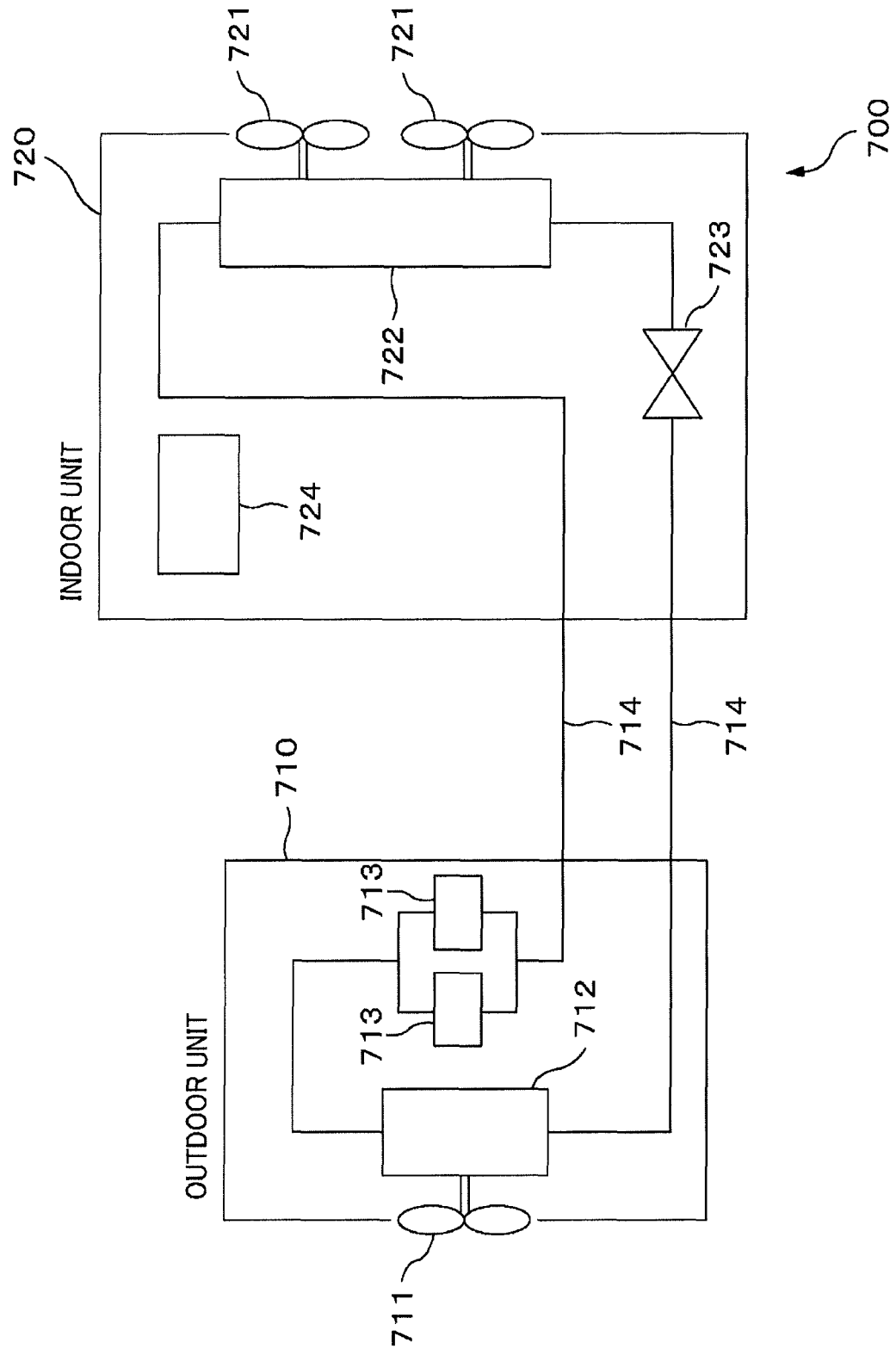
FIG. 9 is a diagram showing a configuration of the air conditioner of the present embodiment.

The air conditioner 700 according to the present embodiment may be configured to include a plurality of constant speed compressors 713 in the indoor unit 710 as shown in FIG. 9. And, the controller 724 increases or decreases the number of compressors 713 to function in accordance with the cooling performance required for the air conditioner 700.

Even in a case where the air conditioner 700 includes a plurality of compressors 713, when only one of the compressors 713 is caused to function, the cooling efficiency of the air conditioner 700 increases as the cooling performance of the air conditioner 700 increases. Here, consider a case where the cooling performance offered by the air conditioner 700 exceeds the performance that can be offered by a single compressor 713, and the controller 724 causes the second compressor 713 to function. In this case, the cooling efficiency is decreased because the electric power to function the two compressors 713 is consumed even though the amount of cooling performance approximately corresponds to the cooling performance offered by a single compressor 713. Then, while the cooling performance of the air conditioner 700 is further increased, the cooling efficiency increases as well until the third compressor 713 is activated.

<Management Server>

The management server 100 according to the present embodiment is a computer that controls load on an information server 800 and load on a storage apparatus 300, thereby operating the air conditioner 700 in each of the air conditioning zones 730 with a high cooling efficiency.

As described in detail below, the load on the information server 800 is controlled by migration of a virtual server 802. In addition, the load on the storage apparatus 300 is controlled by migration of a logical volume 390.

Figure 10:
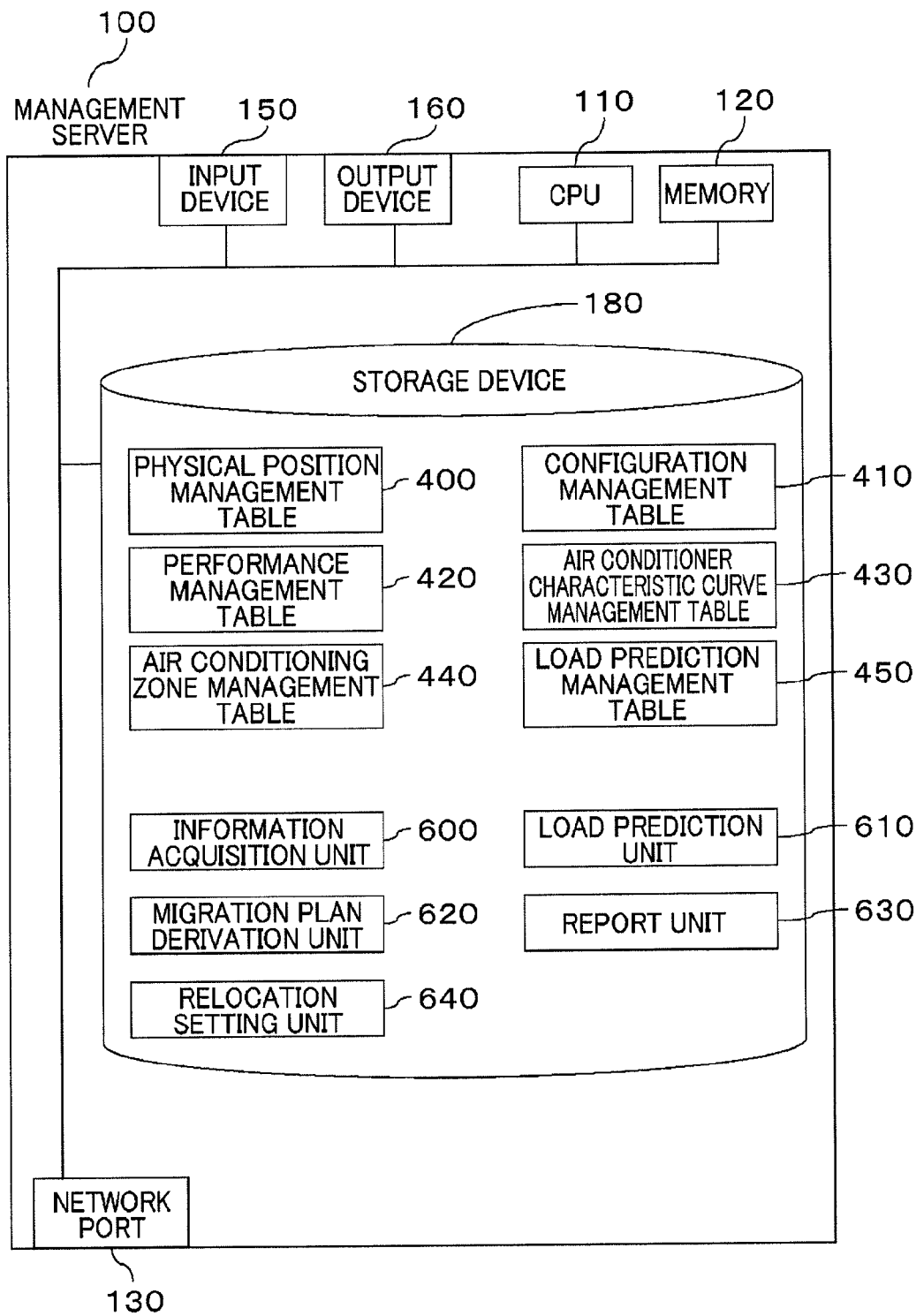
FIG. 10 is a diagram showing a configuration of a management server of the present embodiment.

As shown in FIG. 10, the management server 100 includes a CPU 110, a volatile or nonvolatile memory 120 (RAM or ROM), a storage device 180 (such as an HDD or a semiconductor storage device (SSD)), an input device 150 such as a keyboard or mouse, an output device 160 such as a liquid crystal monitor or a printer and a network port 130 such as a NIC (Network Interface Card) or an HBA (Host Bus Adapter).

The storage device 180 is configured to include an information acquisition unit 600, a load prediction unit 610, a migration plan derivation unit 620, a report unit 630 and a relocation setting unit 640. Specifically, a program for implementing the functions of the information acquisition unit 600, the load prediction unit 610, the migration plan derivation unit 620, the report unit 630 and the relocation setting unit 640 is stored in the storage device 180. The program for providing the aforementioned functions may be configured of a plurality of programs individually providing the respective functions, or a single program providing the functions. When the CPU 110 executes the program, the information acquisition unit 600, the load prediction unit 610, the migration plan derivation unit 620, the report unit 630 and the relocation setting unit 640 are implemented.

In addition, the storage device 180 stores therein a physical position management table 400, a configuration management table 410, a performance management table 420, an air conditioner characteristic curve management table 430, an air conditioning zone management table 440 and a load prediction management table 450, Further, as described in detail below, the physical position management table 400 is configured to include an air conditioner physical position management table 401, a rack physical position management table 402 and an information device physical position management table 403.

Moreover, the configuration management table 410 is configured to include an information server configuration management table 411, a virtual server configuration management table 412, a RAID group configuration management table 413 and a logical volume configuration management table 414.

Moreover, the performance management table 420 is configured to include an information server performance management table 421, a virtual server performance management table 422, a RAID group performance management table 423 and a logical volume performance management table 424.

Further, the load prediction management table 450 is configured to include an information server load prediction management table 451, a virtual server load prediction management table 452, a RAID group load prediction management table 453 and a logical volume load prediction management table 454.

--Information Acquisition Unit--

The information acquisition unit 600 acquires various pieces of information from the information servers 800, the storage apparatuses 300 and the air conditioning control server 200. In addition, the information acquisition unit 600 acquires various pieces of information inputted by the operator via the input device 150.

The information acquisition unit 600 then records the acquired information in the physical position management table 400, the configuration management table 410, the performance management table 420, the air conditioner characteristic curve management table 430 and the air conditioning zone management table 440.

The information acquisition unit 600 acquires position information on each of the air conditioners 700. The position information on each of the air conditioners 700 is input by the operator to the input device 150 with identification information on a corresponding one of the air conditioners 700, for example. Alternatively, the information acquisition unit 600 may be configured to acquire the information through a file having recorded therein in advance the aforementioned information, or an API (Application Program Interface) or the like.

Figure 11:
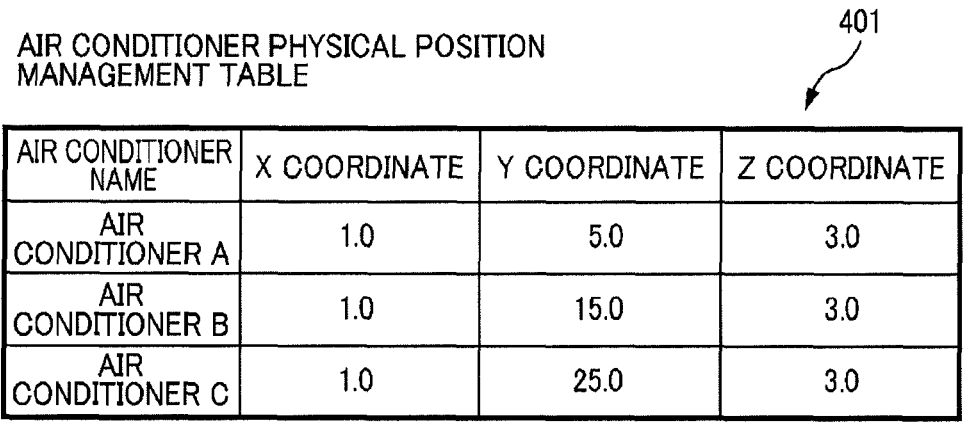
FIG. 11 is a diagram showing an air conditioner physical position management table of the present embodiment.

The position information on the air conditioner 700 is information identifying the position of the air conditioner 700 in the room where the indoor unit 720 is installed. For example, the position information is expressed by a coordinate value for each axis, which corresponds to the position of the indoor unit 720, in a case where each position of space inside the aforementioned room is expressed by a coordinate value, for example, while a predetermined position on a floor surface in the room is used as the origin, on a three-dimensional orthogonal coordinate system of an X axis (axis in parallel with the floor surface, for example), a Y axis (axis in parallel with the floor surface and orthogonal to the X axis, for example) and a Z axis (axis perpendicular to the floor surface, for example). How the identification information and position information on each of the air conditioners 700 is recorded in the air conditioner physical position management table 401 is shown in FIG. 11.

Further, the information acquisition unit 600 acquires position information on each of the racks 1100. The position information on each of the racks 1100 is input by the operator to the input device 150 with identification information on a corresponding one of the racks 1100, for example. Alternatively, the information acquisition unit 600 may be configured to acquire the information through a file having previously recorded therein the aforementioned information, or an API (Application Program Interface) or the like.

Figure 12:
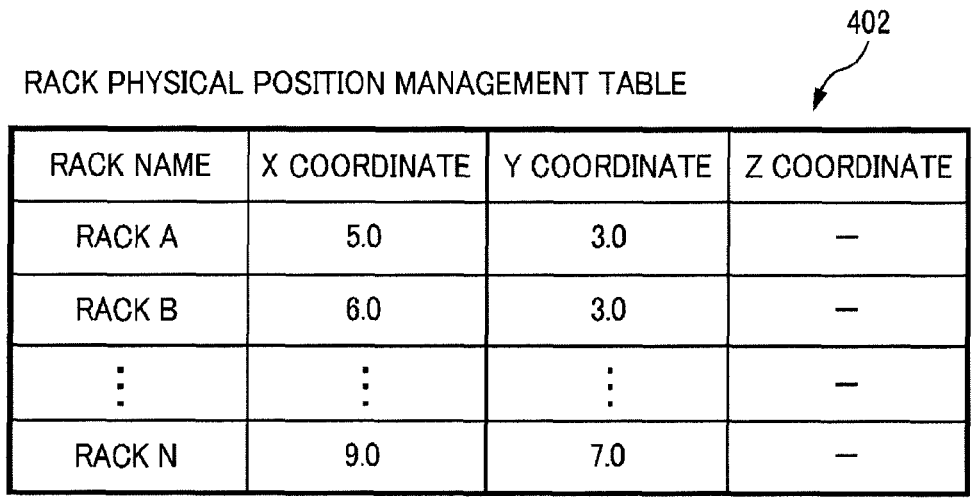
FIG. 12 is a diagram showing a rack physical position management table of the present embodiment.

The position information on the rack 1100 is information identifying the position of the rack 1100 inside a room. The position information is expressed by a coordinate value for each axis, which corresponds to the position of the rack 1100, in a case where each position of the space inside the room is expressed by a coordinate value on the aforementioned three-dimensional orthogonal coordinate system, for example. How the identification information and position information on each of the racks 1100 is recorded in the rack physical position management table 402 is shown in FIG. 12. Note that, since the racks 1100 according to the present embodiment are disposed on the floor surface, values for the Z axis are omitted in FIG. 12 (Z=0, for example). It is a matter of course that in a case where the racks 1100 are stacked one on top of another and disposed in a plurality of layers, the coordinate values of the racks 1100 on the Z axis may be recorded in the rack physical position management table 402 without omitting the values from the table.

Likewise, the information acquisition unit 600 acquires position information on each of the information servers 800 and the storage apparatuses 300. The position information on each of the information servers 800 and the storage apparatuses 300 is input by the operator to the input device 150 with identification information on a corresponding one of the information servers 800 and the storage apparatuses 300, for example. Alternatively, the information acquisition unit 600 may be configured to acquire the information through a file having previously recorded therein the aforementioned information, or an API or the like.

The position information on the information server 800 and the storage apparatus 300 is information identifying the position of the information server 800 and the storage apparatus 300 in a room. The position information is expressed by a coordinate value for each axis, which corresponds to the position of the information servers 800 or the storage apparatus 300, in a case where each position of space inside the room is expressed by a coordinate value on the aforementioned three-dimensional orthogonal coordinate system, for example. How the identification information and position information on each of the information servers 800 and the storage apparatuses 300 is recorded in the information device physical position management table 403 is shown in FIG. 13.

Note that, the information device physical position management table 403 shown in FIG. 13 includes, with the coordinate values of the information servers 800 and the storage apparatuses 300, the identification information on the rack 1100 on which the information servers 800 and the storage apparatuses 300 are mounted. The operator may input the identification information on the rack 1100 when inputting the position information on the information servers 800 and the storage apparatuses 300 to the input device 150. Alternatively, the information acquisition unit 600 may be configured to determine the rack 1100 on which the information servers 800 and the storage apparatuses 300 are mounted, on the basis of the position information on the information servers 800 and the storage apparatuses 300, and the position information on the rack 1100, which has been previously recorded in the rack physical position management table 402, and thereby record the information on the rack 1100 in the information device physical position management table 403. When the latter case is employed, manual input operation performed by the operator can be eliminated. And in addition, incorrect input or the like can be prevented.

The information acquisition unit 600 acquires information indicating a relation between the cooling performance and the cooling efficiency of each of the air conditioners 700. The relation between the cooling performance and the cooling efficiency of each of the air conditioners 700 is input by the operator to the input device 150 with, for example, the identification information on a corresponding one of the air conditioners 700. Alternatively, the information acquisition unit 600 may be configured to acquire the information through a file having previously recorded the information therein, or an API or the like.

The relation between the cooling performance and the cooling efficiency of the air conditioner 700 may be expressed by a table associating the values of cooling performance of the air conditioner 700 with the values of cooling efficiency when the air conditioner 700 offers the cooling performance of the values. Alternatively, the relation between the cooling performance and the cooling efficiency of the air conditioner 700 may be expressed by a relational expression of the cooling performance and the cooling efficiency of the air conditioner 700.

How the identification information on the air conditioners 700 and the relation between cooling performance and the cooling efficiency of each of the air conditioners 700 are recorded in the air conditioner characteristic curve management table 430 is shown in FIG. 14.

Figures 15, 16:
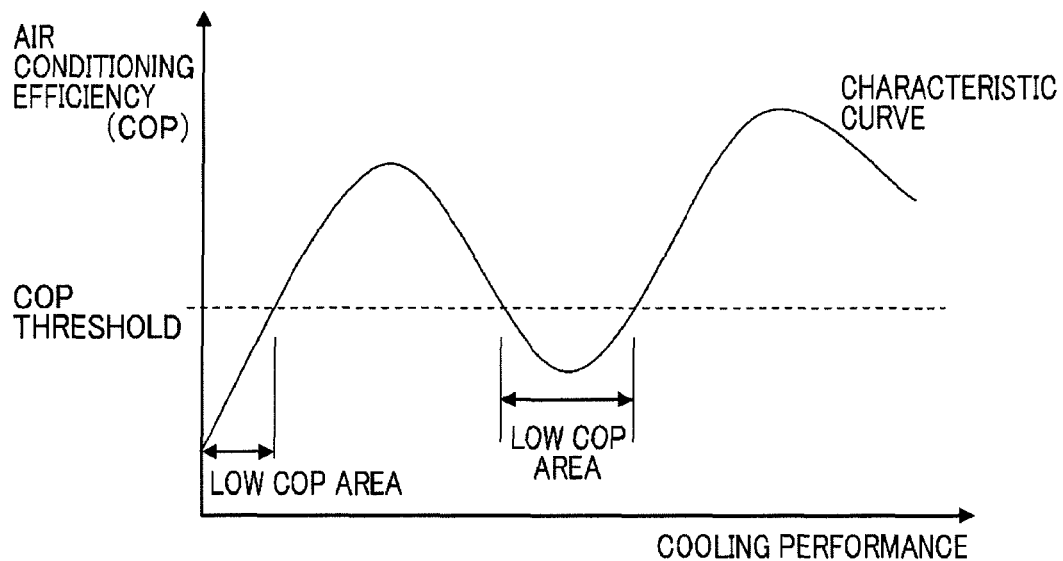
FIG. 15 is a diagram showing a relation between the cooling performance of an air conditioner and the cooling efficiency thereof of the present embodiment.
FIG. 16 is a diagram showing an air conditioning zone management table of the present embodiment.

Here, a graph representing the cooling performance and the cooling efficiency of an air conditioner 700 is shown in FIG. 15. As shown in FIG. 15, the cooling efficiency of the air conditioner 700 changes in various ways in accordance with the cooling performance.

Accordingly, in order to efficiently operate each of the air conditioners 700, it is necessary to control the air conditioner 700 so that it operates at the cooling performance within an appropriate range in consideration of the relation between the cooling performance and the cooling efficiency of the air conditioner 700.

In the present embodiment, the management server 100 controls the load on each of the information servers 800 and the storage apparatuses 300 so that the air conditioner 700 will offer a cooling performance to such an extent as to avoid a range where the cooling efficiency falls below a COP (Coefficient of Performance) threshold as shown in FIG. 15 (hereinafter, such range is also referred to as a "low COP area"). The load on each of the information servers 800 is controlled by migration of a virtual server 802. In addition, the load on each of the storage apparatuses 300 is controlled by migration of a logical volume 390.

The COP threshold set in each of the air conditioners 700 is recorded in a COP threshold column of the air conditioner characteristic curve management table 430 of FIG. 14. Each of the COP thresholds is input by the operator to the input device 150 when the operator inputs the information indicating the relation between the cooling performance and the cooling efficiency of a corresponding one of the air conditioners 700, for example.

Note that, the COP threshold may be a constant value or a value changed in accordance with the value of the cooling performance offered by the air conditioner 700. For example, the COP threshold is set in such a way that the larger the value of the cooling performance offered by the air conditioner 700 is, the lower the value of the COP threshold becomes. In this way, when the total amount of the load on the information servers 800 and the storage apparatuses 300 rapidly increases, and the information servers 800 and the storage apparatuses 300 thus need to be rapidly cooled, the air conditioner 700 can be controlled so as to cool a room with a higher cooling performance even when the cooling efficiency of the air conditioner 700 decreases. Accordingly, the cooling performance of each of the air conditioners 700 can be flexibly controlled by allowing a corresponding one of the COP thresholds to be set freely in accordance with the policy of the operation manager.

The information acquisition unit 600 acquires identification information on the air conditioners 700 and identification information on the racks 1100, which are disposed in each of the air conditioning zones 730. The identification information is input by the operator to the input device 150 together with the identification information on each of the air conditioning zones 730. Alternatively, the information acquisition unit 600 may be configured to acquire the identification information through a file having previously recorded the information therein, or an API or the like.

How the identification information on the air conditioners 700 and the identification information on the racks 1100, which are disposed in each of the air conditioning zones 730, are recorded in the air conditioning zone management table 440 is shown in FIG. 16.

Further, the information acquisition unit 600 acquires configuration information from the information servers 800, the virtual servers 802 and the storage apparatuses 300.

The management server 100 transmits a request for transmission of the configuration information to each of the information servers 800 in order for the information acquisition unit 600 to acquire the configuration information from each of the information servers 800. In response to the request for transmission of the configuration information, each of the information servers 800 transmits, to the management server 100 along with the identification information on the information server 800, each value of the number of CPU cores, the CPU type, the amount of installed memory, the storage capacity and a network bandwidth as the configuration information. Alternatively, the information acquisition unit 600 may be configured to acquire the configuration information through a file having previously recorded the information therein, or an API or the like.

The information acquisition unit 600 records these values in the information server configuration management table 411. How the configuration information acquired from the information servers 800 is recorded in the information server configuration management table 411 is shown in FIG. 17.

Furthermore, the management server 100 transmits a request for transmission of the configuration information to each of the virtual servers 802 in order for the information acquisition unit 600 to acquire the configuration information from each of the virtual servers 802. In response to the request for transmission of the configuration information, each of the virtual servers 802 transmits, to the management server 100 along with the identification information on its own virtual server 802, each value of identification information of the information server 800 implementing the virtual server 802, CPU allocation, memory allocation, storage capacity allocation, and network bandwidth allocation as the configuration information. Alternatively, the information acquisition unit 600 may be configured to acquire the configuration information through a file having previously recorded the information therein, or an API or the like.

The information acquisition unit 600 records these values in the virtual server configuration management table 412. How the configuration information acquired from the virtual servers 802 is recorded in the virtual server configuration management table 412 is shown in FIG. 18.

Furthermore, the management server 100 transmits a request for transmission of the configuration information to each of the storage devices 300 in order for the information acquisition unit 600 to acquire the configuration information from each of the storage devices 300. In response to the request for transmission of the configuration information, each of the storage devices 300 transmits, to the management server 100 along with the identification information on the storage device 300, each value of identification information of the RAID group 340 configured on the storage device 300, the type of storage drive 350 included in the RAID group 340, the RAID level, storage capacity of the RAID group 340, identification information of the logical volume 390 implemented on the RAID group 340 and the storage capacity of the logical volume 390 as the configuration information. Alternatively, the information acquisition unit 600 may be configured to acquire the configuration information through a file having previously recorded the information therein, or an API or the like.

The information acquisition unit 600 records these values in the RAID group configuration management table 413 and the logical volume configuration management table 414. How the configuration information acquired from the storage devices 300 is recorded in the RAID group configuration management table 413 and the logical volume configuration management table 414 is shown in FIGS. 19 and 20. Further, the information acquisition unit 600 acquires performance information from the information servers 800, the virtual servers 802 and the storage apparatuses 300.

The management server 100 transmits a request for transmission of the performance information to each of the information servers 800 in order for the information acquisition unit 600 to acquire the performance information from each of the information servers 800. In response to the request for transmission of the performance information, each of the information servers 800 transmits, to the management server 100 along with the identification information on the information server 800, the CPU utilization rate as the performance information. Here, this CPU utilization rate indicates the load generated by implementing a virtual server 802 with the information server 800 at the current point of time. It is a matter of course that the performance information is not limited to the CPU utilization rate and may be the amount of memory used, the number of I/O operations to or from the storage device 880 or the storage apparatus 300 per unit time, the network load, the number of packets or the like. Further, the performance information may be a combination of these values.

Figure 21:
FIG. 21 is a diagram showing an information server performance management table of the present embodiment.

Further, the information acquisition unit 600 records the received CPU utilization rate and identification information on the information server 800 in the information server performance management table 421 with the current time. How the performance information acquired from the information servers 800 is recorded in the information server performance management table 421 is shown in FIG. 21.

The information acquisition unit 600 acquires the performance information from each of the information servers 800 periodically or irregularly and accumulates the history of the CPU utilization rates of each of the information servers 800 in the information server performance management table 421.

Furthermore, the management server 100 transmits a request for transmission of the performance information to each of the virtual servers 802 in order for the information acquisition unit 600 to acquire the performance information from each of the virtual servers 802. In response to the request for transmission of the configuration information, each of the virtual servers 802 transmits, to the management server 100 along with the identification information on its own virtual server 802, CPU utilization rate of the virtual server 802 as the performance information. Note that, this CPU utilization rate indicates the load on the virtual server 802 at the current point of time. As described above, the performance information is not limited to the CPU utilization rate as a matter of course.

Figure 22:
FIG. 22 is a diagram showing a virtual server performance management table of the present embodiment.

Further, the information acquisition unit 600 records the received CPU utilization rate and identification information on the virtual server 802 in the virtual server performance management table 422 with the current time. How the performance information acquired from the virtual servers 802 is recorded in the virtual server performance management table 422 is shown in FIG. 22.

The information acquisition unit 600 repeatedly acquires the performance information from each of the virtual servers 802 periodically or irregularly and accumulates the history of the CPU utilization rates of each of the virtual servers 802 in the virtual server performance management table 422.

Furthermore, the management server 100 transmits a request for transmission of the performance information to each of the storage devices 300 in order for the information acquisition unit 600 to acquire the performance information from each of the storage devices 300. In response to the request for transmission of the performance information, each of the storage devices 300 transmits, to the management server 100 along with the identification information on the storage device 300, each value of identification information of the RAID group 340 configured on the storage device 300, I/O throughput of the RAID group 340, identification information of the logical volume 390 implemented on the RAID group 340 and the I/O throughput of the logical volume 390 as the performance information. Note that, the total I/O throughput of each of the RAID groups 340 in the storage apparatus 300 indicates the load generated by implementing the logical volumes 390 with the storage apparatus 300 at the current point of time. In addition, the I/O throughput of each of the logical volumes 390 indicates the load on the logical volume 390 at the current point of time. The performance information is not limited to the I/O throughput as a matter of course.

The information acquisition unit 600 records these values in the RAID group performance management table 423 and the logical volume performance management table 424. How the performance information acquired from the storage devices 300 is recorded in RAID group performance management table 423 and the logical volume performance management table 424 is shown in FIGS. 23 and 24.

The information acquisition unit 600 repeatedly acquires the performance information from each of the storage apparatuses 300 periodically or irregularly and then accumulates the history of the acquired performance information in the RAID group performance management table 423 and the logical volume performance management table 424.

--Load Prediction Unit--

The load prediction unit 610 simulates the load on an information server 800 or a storage apparatus 300 on the basis of the history of the load on the information server 800 or the storage apparatus 300, which is accumulated in the performance management table 420.

Specifically, the load prediction unit 610 simulates the predicted values of the CPU utilization rate of the information server 800, the CPU utilization rate of the virtual server 802, the I/O throughput of the RAID group 340 and the I/O throughput of the logical volume 390. The period during which the predicted values are found, the time interval between the predicted values and the like used for the simulation are instructed by the operator when the simulation is to be executed, for example. The load prediction unit 610 records the results obtained by the simulation in the load prediction management table 450.

Figure 27:
FIG. 27 is a diagram showing a RAID group load prediction management table of the present embodiment.
Figure 28:
FIG. 28 is a diagram showing a logical volume load prediction management table of the present embodiment.

Specifically, the load prediction unit 610 records the prediction result for the CPU utilization rate of the information server 800 at each point of time in the information server load prediction management table 451 as shown in FIG. 25. In addition, the load prediction unit 610 records the prediction result for the CPU utilization of the virtual server 802 at each point of time in the virtual server load prediction management table 452 as shown in FIG. 26. Further, the load prediction unit 610 records the prediction result for the I/O throughput of the RAID group 340 at each point of time in the RAID group load prediction management table 453 as shown in FIG. 27. Moreover, the load prediction unit 610 records the prediction result for the I/O throughput of the logical volume 390 at each point of time in the logical volume load prediction management table 454 as shown in FIG. 28.

Note that, various techniques are generally known for the algorithm used by the load prediction unit 610 for simulating the prediction values of the load, and no particular technique is specified as the algorithm to be used herein.

--Migration Plan Derivation Unit--

The migration plan derivation unit 620 creates an allocation pattern plan showing allocation conditions as to which virtual server 802 is to be implemented by which information server 800, and which logical volume is to be implemented by which storage apparatus 300. The migration plan derivation unit 620 thereby identifies an allocation pattern with which the air conditioner 700 in any one of the air conditioning zones 730 is operable with a cooling efficiency not less than the COP threshold.

As described in detail later, the migration plan derivation unit 620 simulates the amount of heat generation for each of the information servers 800 and the storage apparatuses 300 with the current allocation pattern of the virtual servers 802 and the current allocation pattern of the logical volumes 390 and then seeks the cooling performance of the air conditioner 700 in each of the air conditioning zones 730. Then, the migration plan derivation unit 620 determines whether or not there exists, among the air conditioners 700, an air conditioner 700 having a cooling efficiency below the COP threshold.

In a case where it is determined that any one of the air conditioners 700 operates with a cooling efficiency not less than the COP threshold with the current allocation pattern, the migration plan derivation unit 620 determines, on the basis of the predicted values of the load predicted by the load prediction unit 610 at each point of time, whether or not each of the air conditioners 700 is continuously operable for a specified period of time with a cooling efficiency not less than the COP threshold.

If it is determined that there is an air conditioner 700 that operates with a cooling efficiency below the COP threshold at a current time or during a specified period of time or both with the current allocation pattern, the migration plan derivation unit 620 creates a new allocation pattern.

The migration plan derivation unit 620 determines whether or not each of the air conditioners 700 is operable with a cooling efficiency not less than the COP threshold at the current time and during a specified period of time when the arrangements of the virtual servers 802 and the logical volumes 390 are changed in accordance with the new allocation pattern.

In addition, the migration plan derivation unit 620 calculates migration cost required for migrating the virtual servers 802 and the logical volumes 390 in accordance with the new allocation pattern and the benefits of migration for a case where the virtual servers 802 and the logical volumes 390 are migrated in accordance with the new allocation pattern.

Then, the migration plan derivation unit 620 creates a new allocation pattern until a pattern with which each of the air conditioners 700 is operable with a cooling efficiency not less than the COP threshold at the current time and during a specified period of time is identified.

--Report Unit--

The report unit 630 outputs the aforementioned allocation pattern identified by the migration plan derivation unit 620 to the output device 160 as a report with the migration cost for changing the arrangements in accordance with the allocation pattern and the benefits of the migration for a case where the arrangements are changed in accordance with the new allocation pattern.

--Relocation Setting Unit--

When an instruction to change the allocation pattern to the new allocation pattern is issued by the administrator who has reviewed the report outputted from the output device 160, the relocation setting unit 640 causes the virtual servers 802 and the logical volumes 390 to migrate so that the virtual servers 802 and the logical volumes 390 are arranged in accordance with the new allocation pattern. Specifically, the relocation setting unit 640 instructs each of the information servers 800, which is to become the migration source or the migration destination of the virtual servers 802, to migrate the virtual servers 802 and also instructs each of the storage apparatuses 300, which is to become the migration source or the migration destination of the logical volumes 390 to migrate the logical volumes 390.

==Processing Flow==

Next, a flow of processing performed by the management server 100 according to the present embodiment will be described.

As described above, the management server 100 according to the embodiment migrates the virtual servers 802 implemented by each of the information servers 800 and also migrates the logical volumes 390 implemented by each of the storage apparatuses 300. The management server 100 thereby controls the load on each of the information servers 800 and the storage apparatuses 300 to operate the air conditioner 700 in each of the air conditioning zones 730 with a high cooling efficiency.

<Overall Processing Flow>

The flow of overall processing performed by the management server 100 to allow each of the air conditioners 700 to operate with high efficiency will be described with reference to the flowchart shown in FIG. 29.

Note that, although not shown in the flowchart, the management server 100 executes, in advance, processing to accumulate predetermined data in each of the physical position management table 400, the configuration management table 410, the performance management table 420, the air conditioner characteristic curve management table 430 and the air conditioning zone management table 440.

First, the management server 100 receives a migration plan creation instruction inputted by the operator via the input device 150 (S1000). The migration plan creation instruction causes the management server 100 to create a new allocation pattern plan when the allocation pattern of the virtual servers 802 and the logical volumes 390 is changed from the current allocation pattern to a new allocation pattern. Here, the allocation pattern shows which virtual server 802 is to be implemented by which information server 800 and which logical volume 390 is to be implemented by which storage apparatus 300.

In accordance with the new allocation pattern, each of the virtual servers 802 is migrated into a new information server 800 and each of the logical volumes 390 is also migrated into a new storage apparatus 300. As a result, the cooling performance required for each of the air conditioners 700 disposed respectively in the air conditioning zones 730 is changed. Each of the air conditioners 700 is thereby caused to operate with a cooling efficiency not less than the COP threshold.

This migration plan creation instruction includes information indicating a period to simulate, future predicted values of load on the information servers 800 or the storage apparatuses 300, by the management server 100 to create a new allocation pattern, and information indicating time interval between the predicted values. For example, the simulation period may be set to one week, and the time interval between the predictive values may be set to one hour or the like. Here, the result of the simulation is recorded in the load prediction management table 450 as described above.

Next, the management server 100 executes a simulation for the predicted values of the load on the information servers 800 and the storage apparatuses 300 in accordance with the above-mentioned migration plan creation instruction (S1010). As described above, various types of algorithms can be employed as the algorithm used for the simulation.

Further, the management server 100 identifies a new allocation pattern for the virtual servers 802 and the logical volumes 390, with which each of the air conditioners 700 is operable with a cooling efficiency not less than the COP threshold (S1020).

Figure 30:
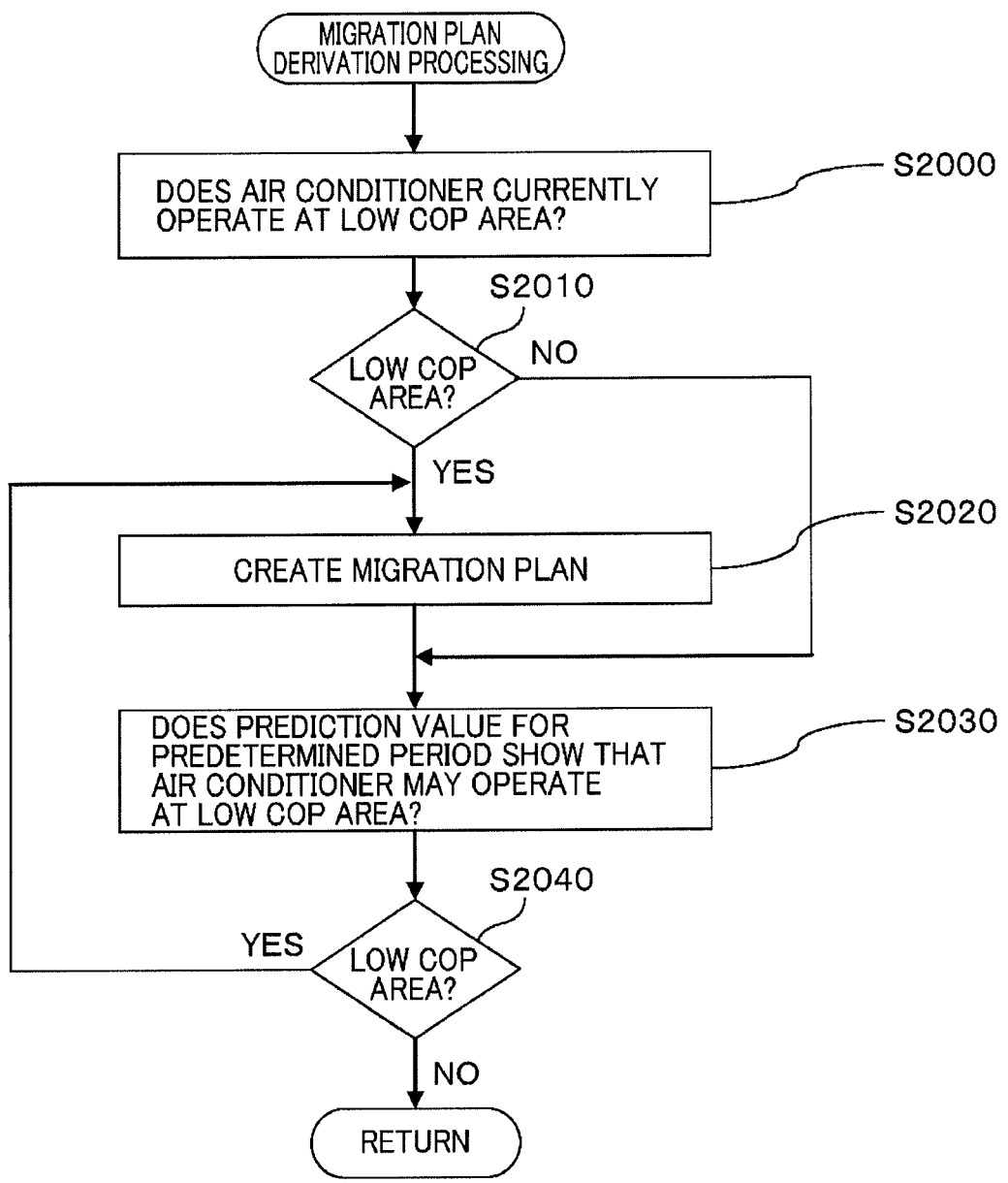
FIG. 30 is a flowchart showing a flow of migration plan derivation processing of the present embodiment.

Details of the processing to identify the new allocation pattern will be described with reference to the flowchart shown in FIG. 30.

First, the management server 100 determines whether or not the cooling efficiency of any of the air conditioners 700 falls below the COP threshold under the state where the information servers 800 and the storage apparatuses 300 implement corresponding virtual servers 802 and logical volumes 390 in accordance with the current allocation pattern (S2000).

Specifically, the management server 100 first refers to the information server performance management table 421 and then acquires the CPU utilization rates of the information servers 800. The management server 100 then multiplies each of the CPU utilization rates by a predetermined coefficient to find the amount of heat generation of a corresponding one of the information servers 800.

The management server 100 also refers to the RAID group performance management table 423 and then acquires I/O throughputs of the storage apparatuses 300. The management server 100 then multiplies each of the I/O throughputs by a predetermined coefficient to find the amount of heat generation of a corresponding one of the storage apparatuses 300.

The management server 100 then refers to the air conditioning zone management table 440 and the physical position management table 400 and, for each air conditioning zone 730, finds a distance between the air conditioner 700 in the air conditioning zone 730 and each of the information servers 800, and a distance between the air conditioner 700 and each of the storage apparatuses 300. Then, the management server 100 finds a cooling performance required for the air conditioner 700, in accordance with the amount of heat generation of each of the information servers 800 and the storage apparatuses 300 and the distance between the air conditioner 700, and a corresponding one of the information servers 800 and the storage apparatuses 300.

For example, the management server 100 multiplies the amount of heat generation of each of the information servers 800 and the storage apparatuses 300 by a coefficient proportional to the distance between the air conditioner 700 and a corresponding one of the information servers 800 and the storage apparatuses 300 and then adds up the amounts of heat generation of the information servers 800 and the storage apparatuses 300 to obtain a total value. The management server 100 then calculates a cooling performance of the air conditioner 700 by multiplying the total value by a predetermined coefficient. When the cooling performance required for the air conditioner 700 is calculated in the manner described above, the larger the distance between the air conditioner 700 and the information server 800 or the storage apparatus 300 is, the larger the cooling performance required for the air conditioner 700 becomes.

The management server 100 then refers to the air conditioner characteristic curve management table 430 and finds the cooling efficiency when the air conditioner 700 offers the aforementioned calculated cooling performance. The management server 100 then compares the cooling efficiency with the COP threshold.

When it is found, as a result of the aforementioned processing, that any of the air conditioners 700 operates with a cooling efficiency not less than the COP threshold, the processing proceeds to "No" in S2010.

Then, the management server 100 determines whether or not the cooling efficiency of any of the air conditioners 700 will not fall below the COP threshold for a period identified by the migration plan creation instruction while maintaining the state where the information servers 800 and the storage apparatuses 300 implement corresponding virtual servers 802 and logical volumes 390 in accordance with the current allocation pattern (S2030).

Specifically, the management server 100 refers to the virtual server load prediction management table 452 and acquires the CPU utilization rate of each of the virtual servers 802 predicted at each point of time. The management server 100 then adds up the CPU utilization rates at each point of time for each of the information servers 800 and then finds the CPU utilization of each of the information servers 800 at each point of time. The management server 100 then multiplies each of the CPU utilization rates by a predetermined coefficient and thereby simulates the amount of heat generation of each of the information servers 800 at each point of time.

The management server 100 also refers to the logical volume load prediction management table 454 and then acquires the I/O throughput of each of the logical volumes 390 predicted at each point of time. The management server 100 then adds up the I/O throughputs at the points of time for each of the storage apparatuses 300 and then finds the I/O throughput of each of the storage apparatuses 300 at each point of time. The management server 100 then multiplies each of the I/O throughputs by a predetermined coefficient and thereby simulates a predicted amount of heat generation of each of the storage apparatuses 300 at each point of time.

The management server 100 then finds a predicted value of the cooling performance required for the air conditioner 700 at each point of time, in accordance with the predicted amount of heat generation of each of the information servers 800 and the storage apparatuses 300 at each point of time and the distance between the air conditioner 700 and a corresponding one of the information servers 800 and the storage apparatuses 300.

For example, the management server 100 multiplies the predicted value of the amount of heat generation of each of the information servers 800 and the storage apparatuses 300 at each point of time by a coefficient proportional to the distance between the air conditioner 700, and a corresponding one of the information servers 800 and the storage apparatuses 300 and then adds up the products to obtain a total value. The management server 100 then multiplies the total value by a predetermined coefficient and thereby calculates the predicted value of the cooling performance of the air conditioner 700 at each point of time.

The management server 100 then refers to the air conditioner characteristic curve management table 430 and finds the cooling efficiency when the air conditioner 700 offers the aforementioned calculated cooling performance. The management server 100 then compares the cooling efficiency with the COP threshold.

In a case where it is found from the above process that any of the air conditioners 700 operates with a cooling efficiency not less than the COP threshold at any point of time, the processing proceeds to "No" in S2040. Specifically, in the above described case, it is found that none of the air conditioners 700 operates with a cooling efficiency below the COP threshold even with the current allocation pattern during the period specified by the migration plan creation instruction.

Alternatively, even if there is a period during which any of the air conditioners 700 operates with a cooling efficiency below the COP threshold, the processing may proceed to "No" in S2040 when the period during which the air conditioner 700 operates with a cooling efficiency below the COP threshold corresponds to a proportion not greater than a predetermined proportion of the specified period.

In a case where the processing proceeds to "No" in S2040, with reference back to FIG. 29, the management server 100 outputs a report showing the result to the output device 160 (S1030). Then, the management server 100 receives from the input device 150 a determination result of the operator who has reviewed the report (S1040).

In the aforementioned case, since no change of allocation pattern is required, the processing proceeds with "cancel" in S1050, and the management server 100 ends the processing.

Meanwhile, if it is found in S2010 of FIG. 30 that at least one of the air conditioners 700 operates with a cooling efficiency below the COP threshold, the processing proceeds to "Yes" in S2010.

The management server 100 in this case creates a new allocation pattern plan (S2020).

The new allocation pattern is created in such a way that a predetermined number of virtual servers 802 and a predetermined number of logical volumes 390 are arbitrarily selected for the current allocation pattern, and then, allocation of the selected virtual servers 802 and logical volumes 390 is changed to arbitrarily selected information servers 800 and storage apparatuses 300, for example.

The aforementioned predetermined number may be included in the migration plan creation instruction or may be registered to the management server 100 in advance. The virtual servers 802 and the logical volumes 390 to be reallocated may be randomly selected, or may be preferentially selected from the virtual servers 802 having a larger number of them allocated to the same information server 800 and from the logical volumes 390 having a larger number of them allocated to the same storage apparatus 300. When the selection is made in the latter manner, the virtual servers 802 and the logical volumes 390 can be more evenly allocated to the information servers 800 and the storage apparatuses 300. Accordingly, it is possible to prevent the occurrence of a situation where load is concentrated on a specific information server 800 or a specific storage apparatus 300, thus causing a prominent increase in the amount of heat generation of the information server 800 or the storage apparatus 300.

On the other hand, the virtual servers 802 or the logical volumes 390 may be preferentially selected from the virtual servers 802 having a smaller number of them allocated to the same information server 800 and from the logical volumes 390 having a smaller number of them allocated to the same storage apparatus 300. When the selection is made in this manner, the virtual servers 802 and the logical volumes 390 can be allocated to a fewer number of the information servers 800 and a fewer number of the storage apparatuses 300 in a concentrated manner. Accordingly, power of an information server 800 to which no virtual server 802 is allocated and power of a storage apparatus 300 to which no logical volume 390 is allocated can be turned off in this case. Thus, the amount of heat generation of the entire information system can be suppressed.

In addition, a new allocation pattern may be randomly created regardless of the current allocation pattern. Accordingly, the processing to create a new allocation pattern can be simplified.

After creating a new allocation pattern plan in the manner described above, the management server 100 calculates a migration cost and benefits of migration of a case where the virtual servers 802 and the logical volumes 390 are caused to migrate in accordance with the new allocation pattern from the current allocation pattern.

For example, the migration cost is the load generated on the information servers 800 or the storage apparatuses 300 for migrating the virtual servers 802 or the logical volumes 390 from the current allocation pattern to the new allocation pattern. The migration cost is calculated on the basis of the amount of data to be transferred between the information servers 800 which are the migration source and migration destination of the virtual servers 802 or the amount of data to be transferred between the storage apparatuses 300 which are the migration source and migration destination of the logical volumes 390.

More specifically, the migration cost is the power consumption required for causing the virtual servers 802 or the logical volumes 390 to migrate in accordance with the new allocation pattern switched from the current allocation pattern, for example. Alternatively, the migration cost may be defined as the amount of heat generated for migrating the virtual servers 802 or the logical volumes 390 in accordance with the new allocation pattern switched from the current allocation pattern.

Meanwhile, the benefit of migration is the amount of change in the cooling efficiency of each of the air conditioners 700 for a case where the virtual servers 802 or the logical volumes 390 are caused to migrate in accordance with the new allocation pattern switched from the current allocation pattern, for example.

More specifically, the benefit of migration may be defined as the power consumption of the air conditioner 700, which can be reduced by migrating the virtual servers 802 or the logical volumes 390 in accordance with the new allocation pattern switched from the current allocation pattern, for example.

The management server 100 calculates the migration cost in the following manner, for example.

In the management server 100, a virtual server migration cost index and a logical volume migration cost performance index are set in advance. The virtual server migration cost index is a coefficient for converting the migration amount of a virtual server 802 into power consumption. Likewise, the logical volume migration cost index is a coefficient for converting the migration amount of a logical volume 390 into power consumption. When the amount of heat generation is defined as the migration cost, a coefficient that can convert each of the aforementioned migration amounts into the amount of heat generation may be used as a matter of course.

The management server 100 calculates the migration cost of a virtual server 802 and the migration cost of a logical volume 390 for a new allocation pattern in the following manner.

First, the management server 100 refers to the management server configuration management table 412 and acquires the memory allocation amount for each of migration target virtual servers 802. This memory allocation amount corresponds to the migration amount of the virtual server 802. Then, the management server 100 multiplies each of the memory allocation amounts of the migration target virtual servers 802 by the virtual server migration cost index and adds up the products to calculate the migration cost of the virtual servers 802.

In addition, the management server 100 refers to the logical volume configuration management table 414 and acquires the capacity of each of the migration target logical volumes 390. This capacity corresponds to the migration amount of the logical volume 390. Then, the management server 100 multiplies each of the capacities of the migration target logical volumes 390 by the logical volume migration cost index and adds up the products to calculate the migration cost of the logical volumes 390.

The management server 100 then adds up the migration cost of the virtual servers 802 and the migration cost of the logical volumes 390 to calculate the migration cost.

For example, consider a case where the virtual server migration cost index is "0.5 W/1 GB," and the volume migration cost index is "1 W/1 GB," and ten virtual servers 802 each having an amount of memory usage of 1 GB and two logical volumes 390 each having a capacity of 10 GB are caused to migrate in accordance with a new allocation pattern. In this case, the migration cost of the virtual servers is 5 W (10 servers×1 GB×(0.5 W/1 GB)), and the migration cost of the logical volumes 390 is 20 W (two volumes×10 GB×(1 W/1 GB)). Thus, the migration cost in total is 25 W.

Alternatively, the management server 100 calculates the benefit of migration in the following manner, for example.

Here, in the management server 100, an information server power consumption index and a storage apparatus power consumption index are set in advance. The information server power consumption index is a coefficient for converting the load on an information server 800 into power consumption. The storage apparatus power consumption index is a coefficient for converting the load on a storage apparatus 300 into power consumption.

The management server 100 first calculates an expected value of power consumption of each of the information servers 800 and an expected value of power consumption of each of the storage apparatuses 300 for the newly created allocation pattern and then adds up the expected values for each of the air conditioning zones 730.

Specifically, the management server 100 refers to the virtual server performance management table 422 and acquires the CPU utilization rates of all of the virtual servers 802. The management server 100 then adds up the CPU utilization rates of the virtual servers 802 allocated to each of the information servers 800 in accordance with the new allocation pattern for each of the information servers 800. The management server 100 then multiplies the aforementioned total value obtained for each of the information servers 800 by the information server power consumption index to find a predicted value of the power consumption of a corresponding one of the information servers 800.

Further, the management server 100 adds up the power consumptions of the information servers 800 for each of the air conditioning zones 730. Note that, the power consumption of an information server 800 in which no virtual server 802 operates in the new allocation pattern is calculated as "0."

Meanwhile, the management server 100 refers to the logical volume performance management table 424 and acquires the I/O throughputs of all of the logical volumes 390. The management server 100 then adds up, for each of the RAID groups 340, the I/O throughputs of the logical volumes 390 allocated to each of the RAID groups 340 in accordance with the new allocation pattern. Then, the management server 100 multiplies the total value obtained for each of the RAID groups 340 by the storage apparatus power consumption index to find a predicted value of the power consumption of each of the RAID groups 340. The management server 100 then adds up the predicted values of the power consumptions of the respective RAID groups 340 for each storage apparatus 300 to find a predicted value of the power consumption of each storage apparatus 300.

Further, the management server 100 adds up the power consumptions of the storage apparatuses 300 for each air conditioning zone 730. Here, the power consumption of a storage apparatus 300 to which no logical volume 390 is allocated in the new allocation pattern is calculated as "0."

Then, the management server 100 adds up, for each of the air conditioning zones 730, the predicted value of the power consumption of the information servers 800 and the predicted value of the power consumption of the storage apparatuses 300, which were calculated for each of the air conditioning zones 730, and thereby finds a predicted value of the power consumption of the information servers 800 and the storage apparatuses 300 for each of the air conditioning zones 730.

Next, the management server 100 calculates a predicted value of the cooling performance required for each of the air conditioners 700, on the basis of the predicted value of the power consumption of the information servers 800 and the storage apparatuses 300 and then calculates a predicted value of the power consumption of each of the air conditioners 700.

Here, the calculation formula to find the cooling performance required for the air conditioner 700 of the air conditioning zone 730 from the power consumptions of the information servers 800 and the storage apparatuses 300 in the air conditioning zone 730 is assumed to be set in advance in the management server 100 by the administrator for each air conditioning zone 730.

The management server 100 calculates, in accordance with the aforementioned calculation formula, the cooling performance required for each of the air conditioners 700. The management server 100 refers to the air conditioner characteristic curve management table 430 and then divides the value of the aforementioned cooling performance by the value of the cooling efficiency when the cooling performance is offered, thereby calculating the power consumption of the air conditioner 700 when the air conditioner 700 offers the aforementioned cooling performance.

The management server 100 finds the power consumption of each of the air conditioners 700 in accordance with the current allocation pattern by the same procedure as that described above.

The management server 100 calculates, as the benefit of migration, a difference between the total value of the power consumptions of the air conditioners 700 with the new allocation pattern and the total value of the power consumptions of the air conditioners 700 with the current allocation pattern.

The management server 100 calculates the benefit of migration in the following manner, for example.

Here, suppose that the information server power consumption index given from the administrator is "1 W per 1% CPU utilization rate," and the storage apparatus power consumption index is "1 W per 1000 I/O throughput value."

Further, suppose that 100 virtual servers 802 each having a 10% CPU utilization rate, and nine logical volumes 390 each having a 10000 I/O throughput value exist with the current allocation pattern in an air conditioning zone A 730. Moreover, suppose that ten virtual servers 802 each having a 30% CPU utilization rate and ten logical volumes 390 each having a 5000 I/O throughput value exist with the current allocation pattern in an air conditioning zone B 730.

With the new allocation pattern, ten virtual servers 802 are migrated from an information server 800 in the air conditioning zone A 730 to an information server 800 in the air conditioning zone B 730, and two logical volumes 390 are migrated from a RAID group 340 in the air conditioning zone A 730 to a RAID group 340 in the air conditioning zone B 730 from the arrangement in the current allocation pattern.

The management server 100 initially calculates the power consumption of each of the air conditioners 700 in accordance with the new allocation pattern.

The management server 100 first calculates a predicted value of the power consumption of an information server 800 in the air conditioning zone A 730 to be 900 W ((100−10)×

10%×(1 W/1%)), and also calculates a predicted value of the power consumption of a storage apparatus 300 to be 70 W ((9−2)×10000×(1/1000)) and thus calculates the total value to be 970 W.

Then the management server 100 calculates a predicted value of the power consumption of an information server 800 in the air conditioning zone B 730 to be 400 W (10×30%×(1 W/1%)+(10×10×(1 W/1%)), and also calculates a predicted value of the power consumption of a storage apparatus 300 to be 70 W (10×5000×(1/1000)+2×10000×(1/1000)) and thus calculates the total value to be 470 W.

Here, when the calculation formula to find the cooling performance required for the air conditioner 700 is given from the predicted value of the power consumption as "cooling performance to be required=predicted value of power consumption×6," for example, the management server 100 performs a calculation and finds that cooling performance of 5.820 kW (970 W×6) is required for the air conditioner 700 of the air conditioning zone A 730 and that the cooling performance of 2.820 kW (470 W×6) is required for the air conditioner 700 of the air conditioning zone B 730.

The management server 100 then refers to the relations between the cooling capacities and the cooling efficiencies, which are stored in the air conditioner characteristic curve management table 430, and then calculates the cooling efficiencies for the air condition zone A 730 and the air condition zone B 730.

For example, the management server 100 calculates the cooling efficiency of the air conditioner 700 in the air condition zone A 730 to be 6.17 and the cooling efficiency of the air conditioner 700 in the air condition zone B 730 to be 1.513.

Then, the management server 100 calculates the power consumption of the air conditioner 700 in the air condition zone A 730 to be 943 W (5820 W/6.17) and the power consumption of the air conditioner 700 in the air condition zone B 730 to be 1864 W (2820 W/1.513).

Next, the management server 100 calculates the power consumption of each of the air conditioners 700 with the current allocation pattern.

The management server 100 first calculates a predicted value of the power consumption of an information server 800 in the air conditioning zone A 730 to be 1000 W (100× 10%×(1 W/1%)), and then calculates a predicted value of the power consumption of a storage apparatus 300 to be 90 W (9×10000×(1/1000)) and thus calculates the total value to be 1090 W.

Next, the management server 100 calculates a predicted value of the power consumption of an information server 800 in the air conditioning zone B 730 to be 300 W (10×30%×(1 W/1%)), then calculates a predicted value of the power consumption of a storage apparatus 300 to be 50 W (10×5000× (1/1000)) and thus calculates the total value to be 350 W.

Then, the management server 100 performs the calculation and finds that the cooling performance of 6.54 kW (1090 W×6) is required for the air conditioner 700 in the air conditioning zone A 730 and that the cooling performance of 2.1 kW (350 W×6) is required for the air conditioner 700 in the air conditioning zone B 730.

The management server 100 refers to the relations between the cooling capacities and the cooling efficiencies, which are stored in the air conditioner characteristic curve management table 430, and then calculates the cooling efficiencies for the air conditioning zone A 730 and the air conditioning zone B 730.

For example, the management server 100 calculates the cooling efficiency of the air conditioner 700 in the air conditioning zone A 730 to be 4.187 and the cooling efficiency of the air conditioner 700 in the air conditioning zone B 730 to be 1.219.

Then, the management server 100 calculates the power consumption of the air conditioner 700 in the air conditioning zone A 730 to be 1562 W (6540 W/4.187) and the power consumption of the air conditioner 700 in the air conditioning zone B 730 to be 1723 W (2100 W/1.219).

The management server 100 then finds a difference between the power consumption of each of the air conditioners 700 with the new allocation pattern and the power consumption of each of the air conditioners 700 with the current allocation pattern. Specifically, the management server 100 calculates the difference for the air conditioner 700 in the air conditioning zone A 730 to be 619 W (1562 W−943 W), and the difference for the air conditioner 700 in the air conditioning zone B 730 to be −141 W (1723 W−1864 W).

With the aforementioned calculation, the management server 100 can find that, as the benefit of migration, the power consumption of the air conditioner 700 in the air conditioning zone A 730 decreases by 619 W while the power consumption of the air conditioner 700 in the air conditioning zone B 730 increases by 141 W.

Subsequently, the management server 100 determines whether or not the cooling efficiency of each of the air conditioners 700 falls below the COP threshold during the period specified by the migration plan creation instruction, in a case where each of the information servers 800 and each of the storage apparatuses 300 implement the virtual servers 802 and the logical volumes 390 with the created new allocation pattern (S2030).

The procedure to perform this determination processing is the same as the procedure to perform determination processing with the current allocation pattern described above.

When a result of the determination shows that there is an air conditioner 700 operating with a cooling efficiency below the COP threshold at any point of time, the processing proceeds to "Yes" in S2040.

Then, the management server 100 creates a candidate of the next allocation pattern and repeatedly executes the aforementioned processing (S2020, S2030).

Note that, the management server 100 may create new allocation patterns in ascending order of migration costs when creating subsequent new allocation patterns.

For example, when creating a first allocation pattern, a combination with the lowest migration cost is used as the migration plan, and when the processing to create a migration plan is executed again, a combination with the second lowest migration cost is used as the migration plan. Accordingly, by creating new allocation patterns sequentially in the aforementioned order, when an allocation pattern with which each of the air conditioners 700 is operable with a cooling efficiency not less than the COP threshold is found first during the determination processing of S2030, the allocation pattern can be set as the allocation pattern with the lowest migration cost.

Further, since a logical volume 390 has a large data size, the migration cost thereof is high in general. Thus, instead of setting all of the virtual servers 802 or the logical volumes 390 as the migration targets as described above, the administrator may be allowed to select in advance any one of creation of an allocation pattern targeting only the virtual servers 802 or creation of an allocation pattern further including migration of the logical volumes 390. Thus, flexible control in accordance with the policy of the administrator can be performed.

When a result of determination in S2030 shows that any of the air conditioners 700 operates with a cooling efficiency not less than the COP threshold at any time of point, the processing proceeds to "No" in S2040. Specifically, it is found that with the new allocation pattern, none of the air conditioners 700 operates with a cooling efficiency below the COP threshold during the period specified by the migration plan creation instruction.

Figure 29:
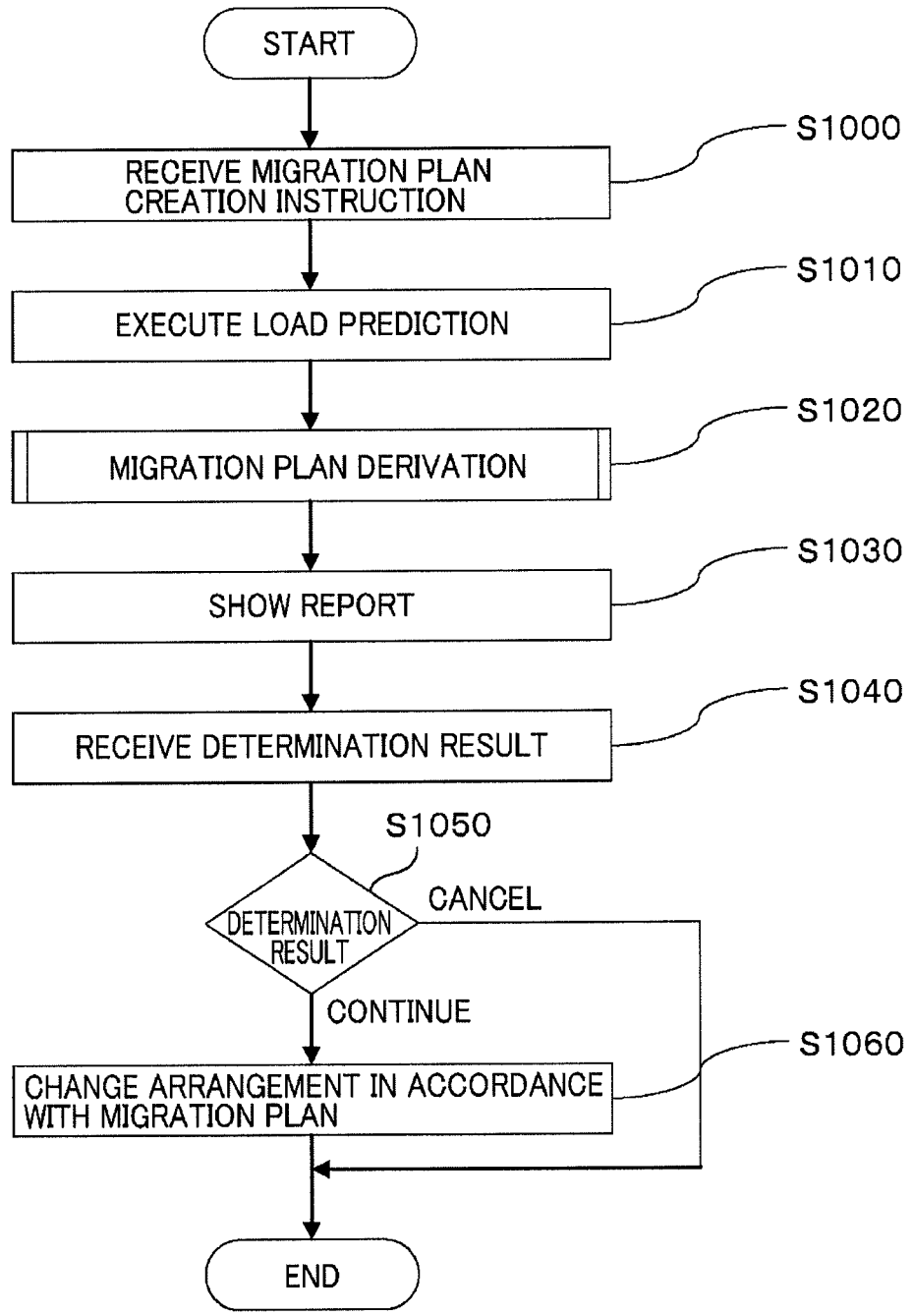
FIG. 29 is a flowchart showing a flow of processing of the embodiment.

In this case, returning to the processing shown in FIG. 29, the management server 100 outputs a report showing the aforementioned result of determination to the output device 160 (S1030). This report includes the migration cost and the benefit of migration of a case where the new allocation pattern is adopted.

Then, the management server 100 receives from the input device 150 a determination result of the operator who has reviewed the report (S1040).

Then, when the management server 100 receives a determination result of the operator, which indicates that the aforementioned new allocation pattern is adopted, from the input device 150, the processing proceeds to "continue" in S1050. Then, the management server 100 instructs each of the information servers 800 and the storage apparatuses 300 to perform migration so that the virtual servers 802 and the logical volumes 390 are implemented in accordance with the aforementioned new allocation pattern (S1060).

On the other hand, when the management server 100 receives a determination result of the operator, which indicates that the aforementioned new allocation pattern is not adopted, from the input device 150, the processing proceeds to "cancel" in S1050 and the processing is terminated. Here, the management server 100 may proceed to S2020 in this case and create a next new allocation pattern.

In the present embodiment, whether or not the cooling efficiency of each of the air conditioners 700 falls below the COP threshold during the period specified by the migration plan creation instruction is determined every time the management server 100 creates a new allocation pattern. And, when the cooling efficiency of each of the air conditioners 700 does not fall below the COP threshold during the specified period, the new allocation pattern is outputted to the output device 160 in this processing. However, the management server 100 can be allowed to initially create a plurality of new allocation patterns first. And among the allocation patterns, an allocation pattern that does not cause the cooling efficiency of each of the air conditioners 700 to fall below the COP threshold during the specified period may be extracted and then outputted to the output device 160.

When allocation patterns are created in the aforementioned manner, the administrator is allowed to view a list of allocation patterns not causing the cooling efficiency of each of the air conditioners 700 to fall below the COP threshold. Thus, the administrator can more appropriately select an allocation pattern.

In a case of the management server 100 according to the present embodiment, the report unit 630 shows a migration plan and power saving effects to the administrator, and the relocation setting unit 640 performs the processing in accordance with a determination result of the administrator (S1040, S1050). However, the management server 100 may be configured to determine, without involving a determination of the administrator, a new allocation pattern by comparing the value of the migration cost or the value of the benefit of migration with a predetermined threshold and then to perform migration of virtual servers 802 or migration of logical volumes 390. Accordingly, the burden on the administrator can be reduced.

In the present embodiment, COP is used as an index showing the cooling efficiency of an air conditioner 700, but the index does not have to be a COP. For example, an annual performance factor (APF) or the like may be used as the index.

When the aforementioned methods are employed, the air conditioner 700 can be used in a highly efficient region. As a result, the power consumption of the air conditioner 700 can be reduced. Moreover, relocation is performed in consideration of a future changes in the load on each of the information servers 800 and the storage apparatuses 300. Thus, the air conditioner can be used in a highly efficient region without performing relocation frequently. Thus, the power consumed for performing relocation can be reduced as well.

Further, in the present embodiment, processing is triggered when the administrator inputs a migration plan creation instruction to the management server 100. However, the management server 100 may be configured to, for example, periodically monitor the COP of an air conditioner 700 and then to check whether or not the COP falls below the COP threshold. When the COP is equal to or greater than the COP threshold, the management server 100 does nothing but stands by for the next COP monitoring timing. On the other hand, when the COP falls below the COP threshold, the management server 100 performs relocation or notifies the administrator that the COP has fallen below the COP threshold. With this configuration, the management burden on the administrator can be reduced. In addition, it is also made possible to promptly respond to a case where the cooling efficiency of an air conditioner 700 has fallen below the COP threshold.

Further, in the present embodiment, whether or not the COP falls below the COP threshold is determined on the basis of the COP acquired from the operation state of an air conditioner 700. Instead, the value of the COP may be simulated on the basis of data recorded in the load prediction management table 450. Then, the predicted value of the COP, which is obtained from the simulation, may be compared with the COP threshold to calculate the time at which the predicted value is determined to fall below the COP threshold. Then, relocation may be performed before the time comes, or the administrator may be notified of the time According to the present embodiment, the time period during which the air conditioning efficiencies of air conditioners 700 are low can be reduced. Thus, the power consumption of a data center including the information servers 800 and the storage apparatuses 300 can be reduced as well.

A preferred embodiment of the present invention has been described above. However, the embodiment is only an exemplary embodiment for describing the present invention and is not intended to limit the scope of the present invention. The present invention can be implemented in various other forms.

For example, in the present embodiment, a case where a room is cooled has been described, but the present invention is applicable to a case where a room is heated.

The invention claimed is:

1. An information apparatus, comprising
    a network port that communicatively couples to a plurality of server apparatuses each configurable to implement a virtual server,
    an air conditioner characteristic curve management table that stores a relation between a first cooling performance and a first cooling efficiency of a first air conditioner arranged in a first room, and a relation between a second cooling performance and a second cooling efficiency of a second air conditioner arranged in a second room, wherein the first and second air conditioners cool the first and second rooms wherein the server apparatuses are arranged, a performance management table that stores a history of a first load on a first server generated by a virtual server implemented in each of the first server apparatuses arranged in the first room, and a history of a second load on a second server generated by a virtual server implemented in each of the second server apparatuses arranged in the second room, and a migration plan derivation unit that creates a plurality of virtual server allocation patterns having varying allocations of virtual servers to be implemented by each of the first server apparatuses and the second server apparatuses, simulates, for each of the created allocation patterns, a first amount of heat generation of each of the first server apparatuses on a basis of the history of the first load on the first server apparatus, simulates, for each of the created allocation patterns, a second amount of heat generation of each of the second server apparatuses on the basis of the history of the second load on the second server apparatus, seeks a first cooling performance required to be offered by the first air conditioner on a basis of the simulated first amount of heat generation, and seeks a second cooling performance required to be offered by the second air conditioner on the basis of the simulated second amount of heat generation, and identifies the allocation pattern with which the first cooling efficiency corresponding to the sought first cooling performance is not less than a first threshold set in advance and the second cooling efficiency corresponding to the sought second cooling performance is not less than a second threshold set in advance.

2. The information apparatus according to claim 1, wherein the air conditioner comprises a plurality of compressors individually controllable as to whether to function or not, and increases or decreases the number of compressors to function depending on a cooling performance required to be offered by the air conditioner.

3. The information apparatus according to claim 1, wherein the migration plan derivation unit seeks load generated on each of the server apparatuses, on the basis of an amount of data to be transferred between the server apparatuses for migration of the virtual servers to change a current allocation state of the virtual servers implemented by each of the server apparatuses to an allocation state corresponding to the identified allocation pattern, and determines whether or not to perform the migration on the basis of the sought load.

4. The information apparatus according to claim 3, wherein the migration plan derivation unit seeks load on the basis of the amount of data to be transferred between the server apparatuses for the migration.

5. The information apparatus according to claim 1, wherein the migration plan derivation unit seeks an amount of change in cooling efficiency of the air conditioner due to migration of the virtual servers to change the current allocation state of the virtual servers implemented by each of the server apparatuses to the allocation state corresponding to the identified allocation pattern, and determines whether or not to perform the migration in accordance with the sought amount of change.

6. The information apparatus according to claim 1, wherein the server apparatuses are each arranged in at least one chassis disposed in the room.

7. The information apparatus according to claim 1, wherein the network port communicatively couples to a plurality of storage apparatuses each configurable to implement a logical volume for storing therein data to be accessed by the virtual servers, the storage apparatuses being arranged inside the room with the server apparatuses, the performance management table stores a history of load on each of the storage apparatuses, the load being generated due to access to the logical volume implemented in the storage apparatuses, the migration plan derivation unit creates a plurality of allocation patterns for the logical volumes, the allocation patterns having varying allocations of the logical volumes to be implemented by the storage apparatuses, simulates, for each of the created allocation patterns for the logical volumes, an amount of heat generation of each of the storage apparatuses on the basis of the history of the load on the storage apparatus generated due to access to the logical volume, and seeks a cooling performance required to be offered by the air conditioner, on the basis of the simulated amounts of heat generation of the storage apparatuses and the simulated amounts of heat generation of the server apparatuses, and identifies the allocation pattern with which the cooling efficiency corresponding to the cooling performance sought is not less than a threshold previously set.

8. The information apparatus according to claim 1, wherein the relocation setting unit migrates the virtual servers to accord with the identified allocation pattern.

9. A method of optimizing cooling efficiency of an air conditioner which cools a room, wherein a plurality of server apparatuses, each configurable to implement a virtual server, are arranged, the air conditioner configured to autonomously control cooling performance thereof in accordance with temperature inside the room, and an information apparatus is communicatively coupled to the server apparatuses, the method comprising:

storing a relation between a first cooling performance and a first cooling efficiency of a first air conditioner arranged in a first room, and a relation between a second cooling performance and a second cooling efficiency of a second air conditioner arranged in a second room;

storing a history of a first load on a first server generated by a virtual server implemented in each of the first server apparatuses arranged in the first room, and a history of a second load on a second server generated by a virtual server implemented in each of the second server apparatuses arranged in the second room;

creating a plurality of virtual server allocation patterns having varying allocations of the virtual servers to be implemented by each of the first server apparatuses and the second server apparatuses, simulating, for each of the created allocation patterns, a first amount of heat generation of each of the first server apparatuses on a basis of the history of the first load on the first server apparatus;

simulating, for each of the created allocation patterns, a second amount of heat generation of each of the second server apparatuses on the basis of the history of the second load on the second server apparatus, seeking a first cooling performance required to be offered by the first air conditioner, on a basis of the simulated first amount of heat generation; and seeking a second cooling performance required to be offered by the second air conditioner on the basis of the simulated second amount of heat generation, and identifying the allocation pattern with which the first cooling efficiency corresponding to the sought first cooling performance is not less than a first threshold set in advance and the second cooling efficiency corresponding to the sought second cooling performance is not less than a second threshold set in advance.

* * * * *